(12) United States Patent
Kress et al.

(10) Patent No.: US 11,867,912 B2
(45) Date of Patent: Jan. 9, 2024

(54) METASURFACE WAVEGUIDE COUPLERS

(71) Applicant: Imagia, Inc., Las Vegas, NV (US)

(72) Inventors: Gregory Kress, Las Vegas, NV (US);
Abdoulaye Ndao, Brookline, MA (US);
Arindom Datta, Fremont, CA (US)

( * ) Notice: Subject to any disclaimer, the term of this patent is extended or adjusted under 35 U.S.C. 154(b) by 0 days.

(21) Appl. No.: 18/342,007

(22) Filed: Jun. 27, 2023

(65) Prior Publication Data
US 2023/0375841 A1  Nov. 23, 2023

Related U.S. Application Data

(62) Division of application No. 18/170,549, filed on Feb. 17, 2023.

(60) Provisional application No. 63/365,116, filed on May 20, 2022.

(51) Int. Cl.
*G02B 6/34* (2006.01)
*G02B 6/10* (2006.01)
*G02B 27/01* (2006.01)
*G03F 7/00* (2006.01)

(52) U.S. Cl.
CPC ....... *G02B 27/0172* (2013.01); *G03F 7/0005* (2013.01); *G02B 2027/0123* (2013.01)

(58) Field of Classification Search
CPC ........ G02B 27/0172; G02B 2027/0123; G02B 6/29334; G02B 6/3534; G02B 6/34; G02B 5/1857; G03F 7/0005; G02F 2201/302; G02F 2201/307; G02F 2201/346; G02F 2202/30; G02F 2202/32; G02F 2202/346; G02F 2203/02; G01J 1/0455; G01J 2003/1208; G01J 2003/1847; C23C 16/345

USPC ................................. 385/36–37, 129–132
See application file for complete search history.

(56) References Cited

U.S. PATENT DOCUMENTS

| | | | |
|---|---|---|---|
| 2014/0043846 A1* | 2/2014 | Yang | G02B 6/0035 362/606 |
| 2018/0052501 A1* | 2/2018 | Jones, Jr. | G02B 5/3025 |
| 2018/0252857 A1 | 9/2018 | Glik | |
| 2018/0322845 A1* | 11/2018 | Machida | G02B 27/0172 |
| 2019/0265486 A1 | 8/2019 | Hansotte | |

(Continued)

FOREIGN PATENT DOCUMENTS

WO   2021242667 A1   12/2021

OTHER PUBLICATIONS

PCT International Patent Application PCT/US2023/062777, Invitation to Pay Additional Fees dated Jul. 31, 2023, 2 pp.

(Continued)

*Primary Examiner* — Kaveh C Kianni
*Assistant Examiner* — Hung Q Lam
(74) *Attorney, Agent, or Firm* — PCFB, LLC; Justin K. Flanagan

(57) ABSTRACT

This disclosure provides various examples and methods of manufacturing metasurface couplers, including slanted grating metasurface couplers characterized by a plurality of parallel, elongated angled ridges. In some examples, a transmission-mode metasurface coupler with a slanted grating is used to couple optical radiation into a waveguide. In some examples, a reflection-mode metasurface coupler with a slanted grating and reflective layer is used to couple optical radiation into a waveguide.

16 Claims, 34 Drawing Sheets

(56) References Cited

U.S. PATENT DOCUMENTS

2022/0283378 A1   9/2022   Waldem

OTHER PUBLICATIONS

U.S. Appl. No. 18/170,549, Non-Final Office Action dated Sep. 1, 2023, 11 pp.
PCT International Patent Application No. PCT/US23/62777, International Search Report and Written Opinion dated Oct. 10, 2023, 10 pp.

* cited by examiner

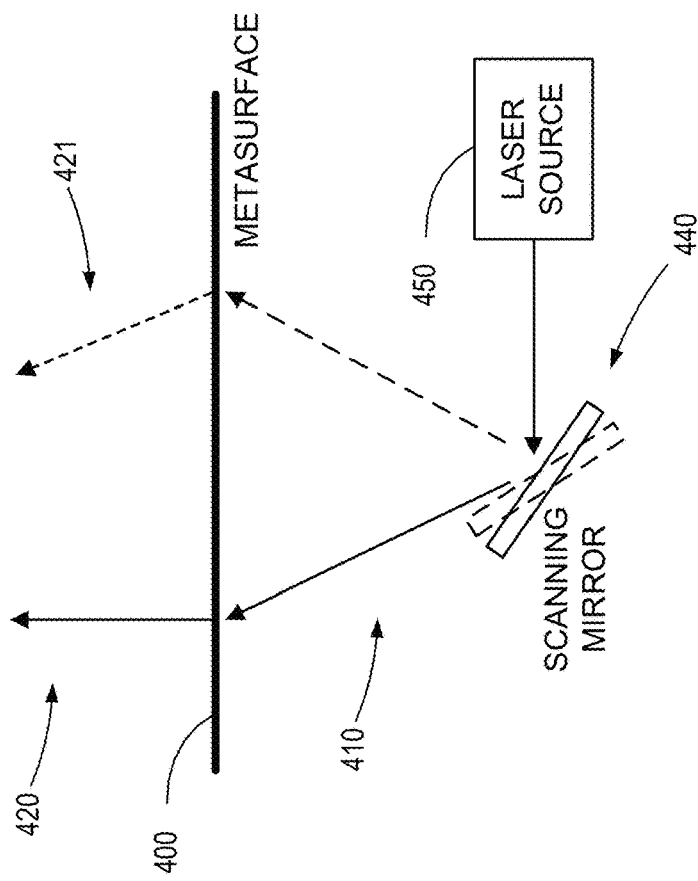
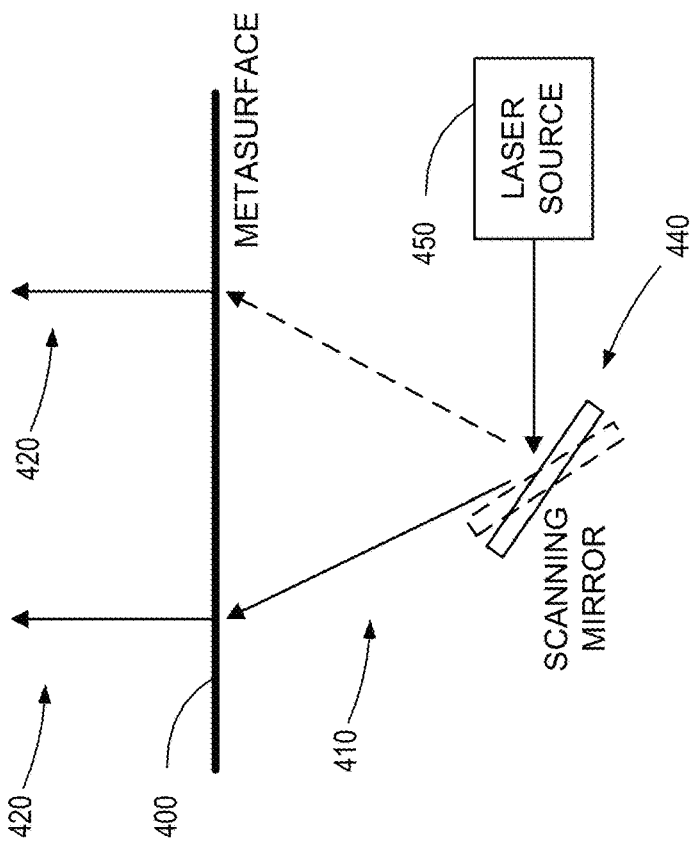

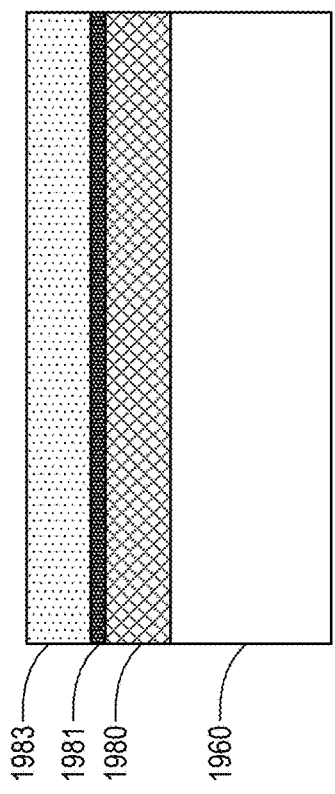
FIG. 19B Coat ma-N Resist
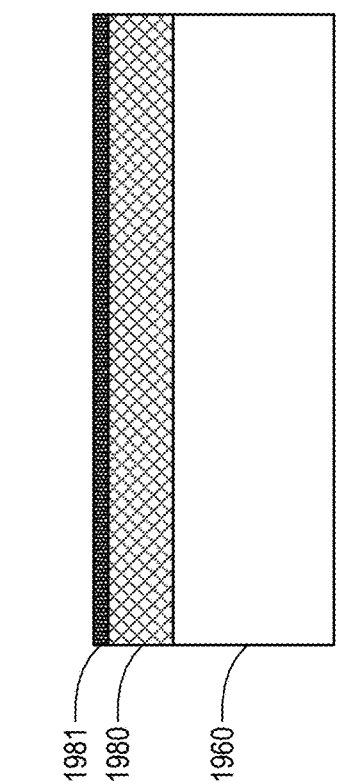
FIG. 19A Deposit Thin Pd/Au on SiNx
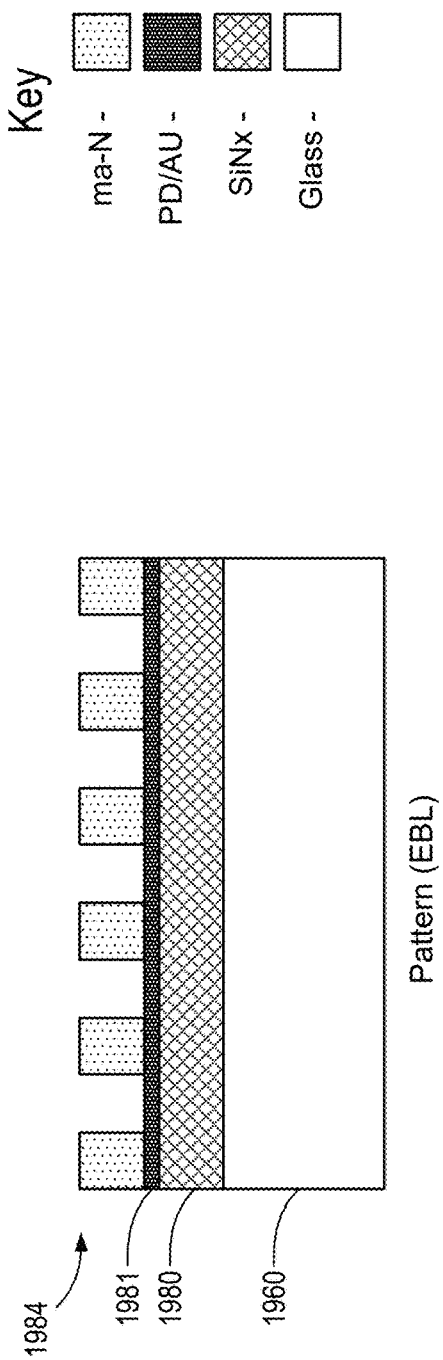
FIG. 19C Pattern (EBL)

Sputter Etch Pd/Au

Etch SiNx to Target Depth

Remove Residual Resist and Etch Pd/Au from SiNx

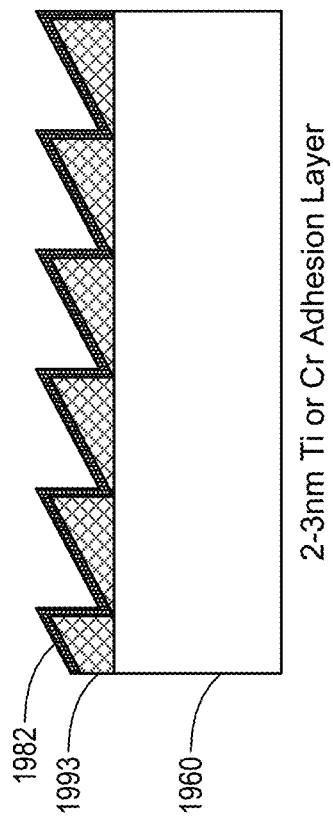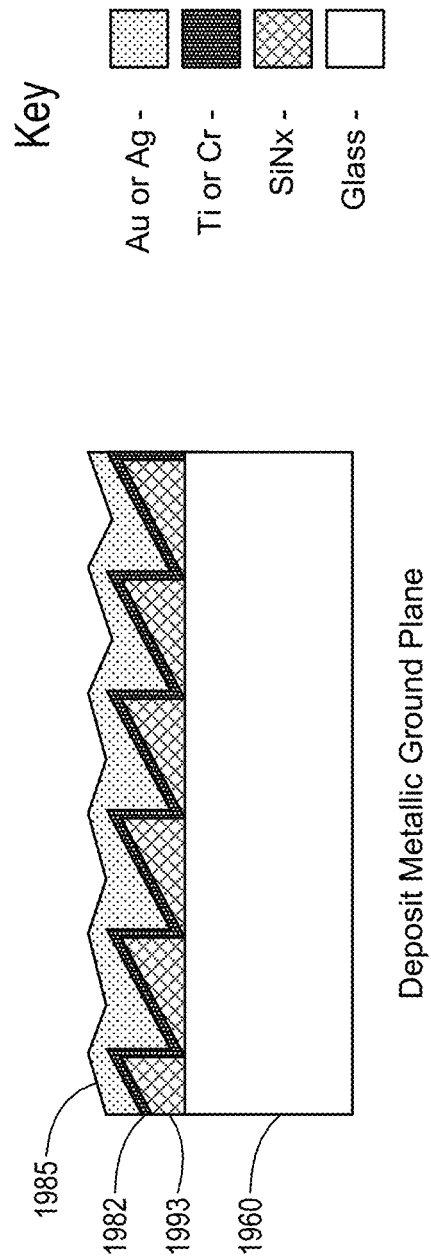
FIG. 19I
FIG. 19J

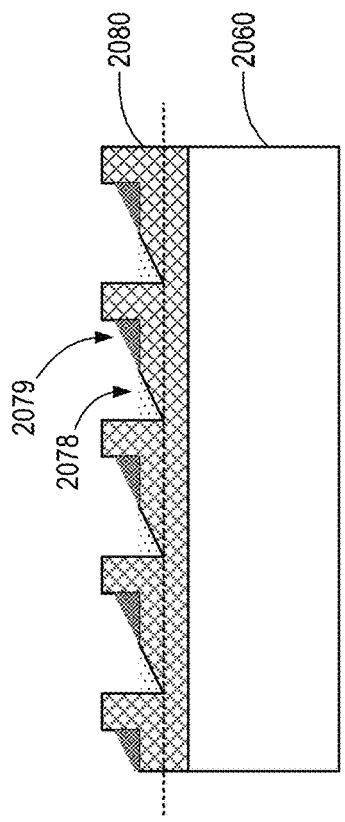
FIG. 20A
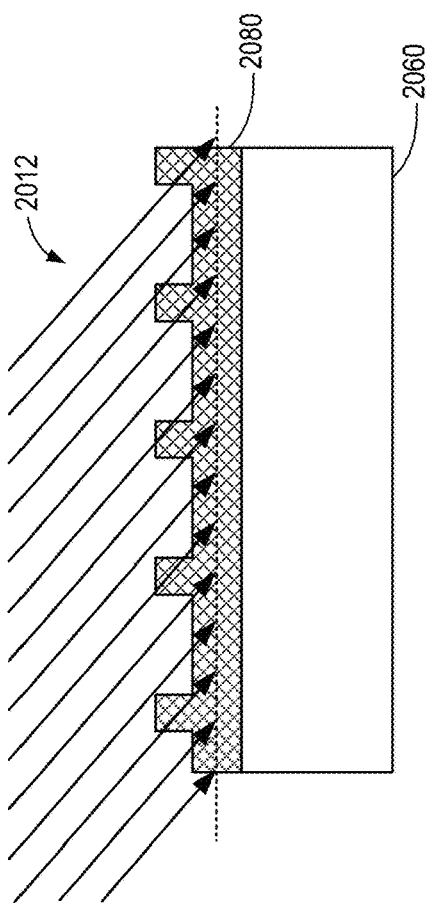
FIG. 20B
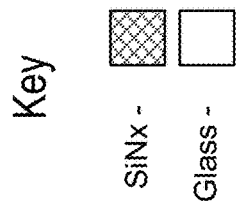
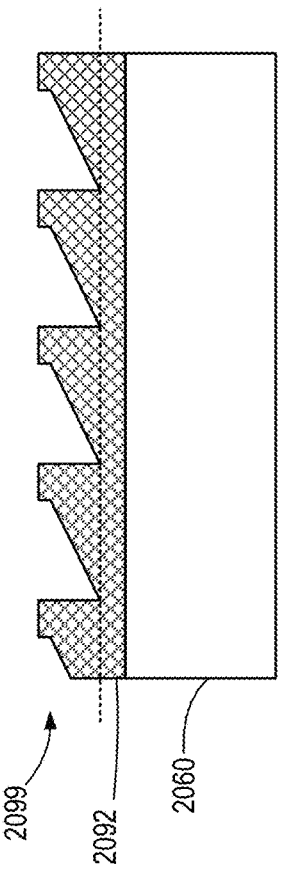
FIG. 20C

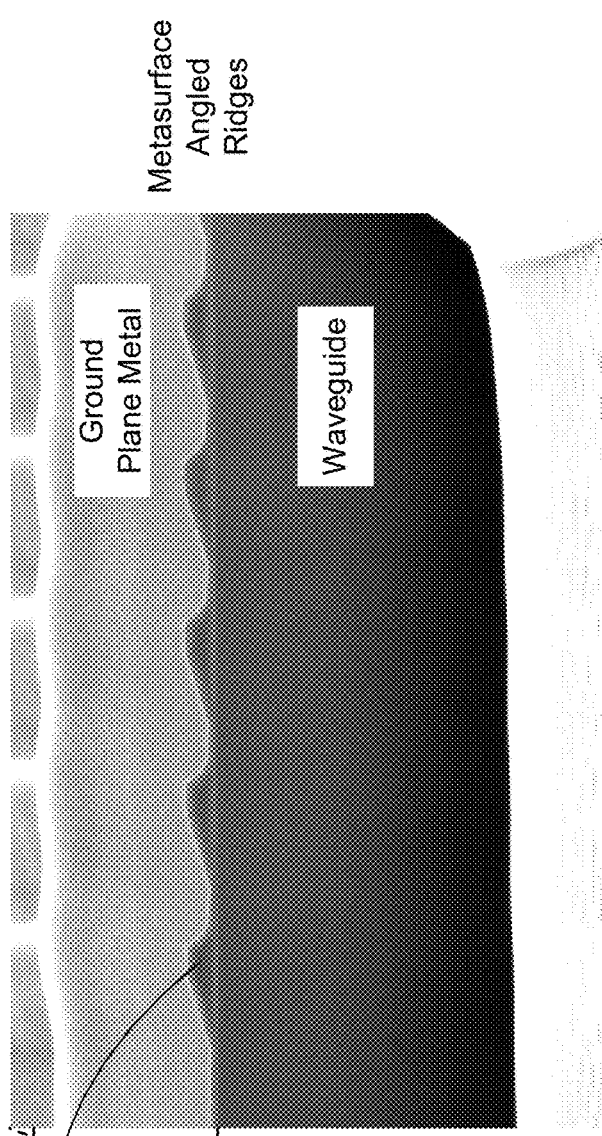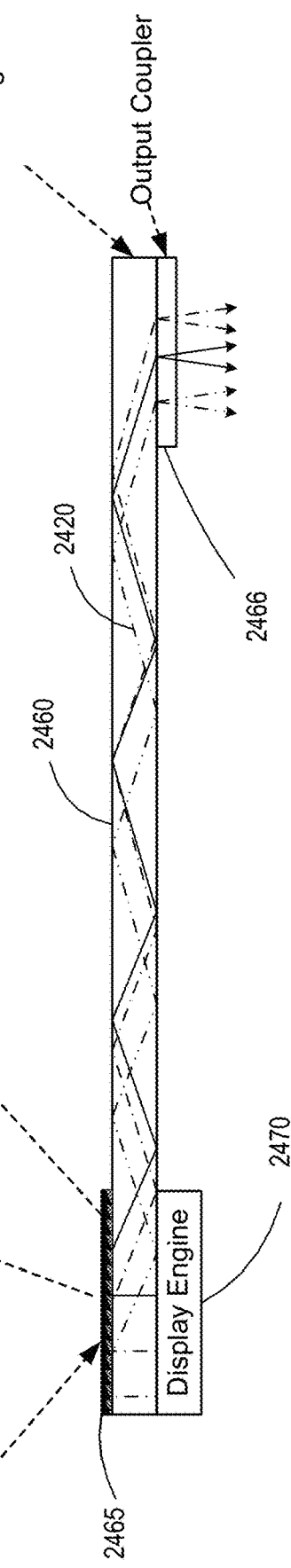
FIG. 24B
FIG. 24A

METASURFACE WAVEGUIDE COUPLERS

PRIORITY APPLICATIONS

This application is a divisional application of U.S. patent application Ser. No. 18/170,549 filed on Feb. 17, 2023 with the same title, which application claims benefit under 35 U.S.C. § 119(e) and priority to U.S. Provisional Patent Application No. 63/365,116, filed on May 20, 2022, titled "Through-Waveguide Reflective Metasurface Couplers," which application is hereby incorporated by reference in its entirety.

TECHNICAL FIELD

This disclosure relates to metamaterial optical devices to control the deflection of optical radiation. This disclosure also relates to optical waveguides, including optical waveguides for conveying red, green, and blue (RGB) optical radiation for image display, image projection, and image capture.

BRIEF DESCRIPTION OF THE DRAWINGS

FIGS. 4A-4B illustrate metasurfaces used in conjunction with laser-scanning subsystems, according to various embodiments.

FIGS. 19A-J illustrate a diagram of a manufacturing process for a metasurface coupler, according to one embodiment.

FIGS. 20A-C illustrate a diagram of an additive ion beam etching process to form the elongated slanted ridges of silicon nitride of a slanted grating, according to one embodiment.

FIG. 24A illustrates a diagram of an optical system with a slanted grating metasurface coupler of elongated silicon nitride angled ridges to couple optical radiation into a waveguide, according to one embodiment.

FIG. 24B illustrates a close-up image of a portion of the slanted grating metasurface coupler, according to one embodiment.

DETAILED DESCRIPTION

Figure 1C:
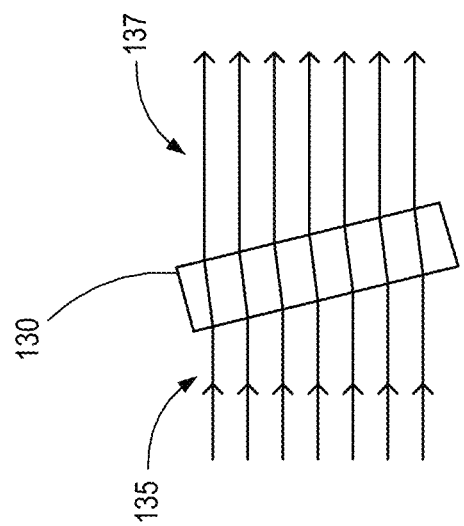
FIGS. 1A-1C illustrate examples of optical paths through concave, convex, and flat plate optical lenses, respectively, according to various embodiments.

Various systems and apparatuses are described herein, along with methods of manufacturing such systems and apparatuses, that operate to deflect optical radiation into a waveguide for conveyance along a length thereof. Various examples of optical metasurfaces are described herein for operation in the visible spectrum. Metasurfaces may be used, for example, to couple optical radiation into waveguides of near-eye displays (NEDs), such as head-mounted displays (HMD) and wearable displays. An input coupler or "in-coupler" may be formed as a metasurface to couple an image source to a waveguide. The waveguide may convey the optical radiation along the length thereof for subsequent processing, free-space transmission, projection, and/or output via an output coupler. In some embodiments, the output coupler may comprise a metasurface or grating, as described herein, to decouple optical radiation from the waveguide instead.

For example, an output coupling metasurface may deflect and focus the optical radiation (e.g., based on the frequency thereof and/or with a frequency selective filter) to form an image visible to one eye of a user. In some embodiments, the output coupling metasurface may be used to deflect and focus the optical radiation as a stereo image or as a duplicated image on both eyes of the user or even on the eyes of multiple users.

Various embodiments described herein are configured to operate in conjunction with an electronic display. In one example, a multi-pixel LED display generates optical radiation at various wavelengths (e.g., different visible colors of light) using at least three different colors of LED subpixels (e.g., red, green, and blue subpixels for an RGB display). A metasurface layer may include a plurality of metasurface subpixels. Each metasurface subpixel may correspond to one of the LED subpixels. In some embodiments, a multi-frequency metasurface subpixel may be responsive to multiple frequencies allowing a single multi-frequency metasurface subpixel to be used for each pixel of the RGB display.

In some embodiments described herein, a transmission metasurface comprises a metasurface of rectangular ridges of polysilicon (Poly-Si). The rectangular ridges may be formed with interelement spacings, heights, and widths selected to couple a broad spectrum of optical radiation, or at least specific wavelengths of optical radiation (e.g., red, green, and blue wavelengths), into an optical waveguide.

The embodiments described above operate to couple optical radiation from an optical radiation source through the metasurface into an optical waveguide. More specifically, the metasurface receives the optical radiation in the first instance and deflects it into the optical waveguide at an angle for total internal reflection (TIR) within the waveguide. As such, the optical radiation enters the optical waveguide for the first time at an angle greater than or equal to a critical angle for total internal reflection and conveyance along the length of the optical waveguide. As used herein, the term critical angle or $\theta_c$ refers to the smallest angle of incidence that yields total reflection within the waveguide, such that total internal reflection occurs when the angle of incidence is greater than the critical angle.

In contrast to the transmission approach above, other embodiments described herein include a metasurface that operates to reflect optical radiation into the waveguide for total internal reflection. In some such embodiments, a metasurface is utilized in a configuration in which the optical radiation travels from an optical radiation source through the waveguide before being deflected by the metasurface back into the waveguide. The optical radiation travels through the waveguide at an angle greater than the critical angle, such that the optical radiation passes through the optical waveguide. After passing through the waveguide, the optical radiation is reflected by the metasurface back into the waveguide at an angle less than the critical angle for total internal reflection within and conveyance along the length of the waveguide.

According to various embodiments, a metasurface is configured to couple optical radiation into a waveguide and is formed as a slanted grating of elongated angled ridges, such as elongated angled ridges whose cross-section approximates a triangle (e.g., a right triangle). A slanted grating metasurface may be formed on a planar surface of a waveguide. The slanted grating metasurface includes an array of elongated angled ridges that extend parallel to one another along the width of the waveguide surface. The elongated angled ridges may be shaped to approximate right-angle triangular polyhedrons that extend along the width of the waveguide and deflect optical radiation for conveyance along the length of the waveguide. The elongated angled ridges of the slanted grating may be formed directly on the surface of the waveguide. Alternatively, the elongated angled ridges of the slanted grating may be formed in a base layer of material that is deposited directly on the surface of the waveguide, where a thin base layer remains between the slanted grating of elongated angled ridges and the waveguide surface.

As an example, the slanted grating metasurface may be formed as a one-dimensional array of angled ridges of silicon nitride (SiNx) directly on a glass or sapphire waveguide. In some embodiments, the angled ridges of silicon nitride may extend from a thin residual base layer of silicon nitride on the glass or sapphire waveguide. In various embodiments, a reflective metallic layer is deposited on the angled ridges of the slanted grating to reflect optical radiation with high efficiency. The heights, interelement spacing (pitch or distance between adjacent angled ridges), and the relative angles of the faces of each of the angled ridges are selected to deflect optical radiation back into the underlying waveguide at an angle less than or equal to the critical angle for total internal reflection within the waveguide.

For example, the slanted grating may include a plurality of elongated angled ridges, where the cross-section of each elongated angled ridge approximates a right triangle. The hypotenuse face of each elongated angled ridge (e.g., of silicon nitride) in the slanted grating may form an angle between 15 and 25 degrees relative to the planar face of the waveguide. Each elongated angled ridge may extend to a height between approximately 70 nanometers and 200 nanometers and the spacing or pitch between adjacent elongated silicon nitride angled ridges may be between 300 and 500 nanometers. Accordingly, the dimensions of the elements in the slanted grating metasurface are referred to as "subwavelength" since they are smaller than the wavelengths of light being deflected.

According to various embodiments, an optical system comprises a waveguide, an optical source to generate optical radiation, and a metasurface to couple the optical radiation into the waveguide. The optical source may generate optical radiation that is incident on a first face of the waveguide at an angle of incidence at which the optical radiation passes through the waveguide and out of a second, opposing face of the waveguide.

The metasurface may be positioned on a second face of the waveguide to receive the optical radiation that passes through the waveguide from the optical source. The metasurface operates to reflect the optical radiation back into the waveguide at an angle greater than the critical angle for total internal reflection within the waveguide. The optical radiation may then be conveyed along the length of the waveguide.

Any of a wide variety of optical radiation sources may be used in conjunction with metasurface couplers including, without limitation, an array of lasers, an array of light-emitting diodes (LEDs), an array of micro-LEDs, and/or an array of organic light-emitting diodes (OLEDs).

As described herein according to various embodiments, the metasurface may be embodied as or include a slanted grating of angled ridges that extend along a width of the waveguide (i.e., perpendicular to the length of the waveguide). One or more reflective metallic layers may be overlaid on the upper surface (the surface opposite the surface in contact with the waveguide) of the elongated angled ridges. The slanted grating may be, for example, formed as an array of elongated angled ridges in a silicon nitride layer deposited on the second face of the waveguide.

As an example, each elongated angled ridge in the slanted grating may have a cross-section that approximates a triangle, such that each of the elongated angled ridges has a shape approximating a triangular polyhedron. In some examples, each elongated angled ridge in the slanted grating may have a cross-section that approximates a right triangle, such that each of the elongated angled ridges has a shape approximating a right-angle triangular polyhedron.

In such embodiments, each elongated angled ridge in the slanted grating may include a base face that is co-planar with the waveguide, a height face that extends from the base face to a target height (e.g., 70-200 nanometers) at a steep angle approaching 90 degrees relative to the base face, and an angled face (or hypotenuse face) that extends between the edge of the base face and an edge of the height face at a target internal angle to deflect the optical radiation for total internal reflection within the waveguide. An example of a suitable target internal angle for the angled or hypotenuse face of an elongated angled ridge is 20 degrees for deflection of red, green, and blue optical radiation. In other embodiments with elongated angled ridges having different dimensions and/or for operation at different wavelengths, the angle of the angled face or hypotenuse face relative to the base face of each elongated angled ridge in the slanted grating may vary between approximately 15 and 25 degrees.

Many of the elements described herein are characterized or described in terms of triangles, squares, rectangles, and other geometric shapes and corresponding polyhedrons for convenience only. It is appreciated by those of skill in the art that microfabrication and nanofabrication techniques, such as lithography techniques, deposition techniques, etching techniques, ion beam etching, and the like are imprecise in some instances. As such, an element described as being embodied as or approximating a specific geometric shape or volume with one or more "corners," "edges," or "faces" may include fabrication imperfections, such as rounded corners, imperfect planar faces, and/or rounded edges. As such, descriptions of elements throughout this disclosure that are provided in the context of geometric shapes, geometric polyhedrons, planar faces or surfaces, edges, or corners should be understood in the context of the nanofabrication techniques applicable to the scale of the element being described or characterized.

As an example, at least some corners or edges of elongated angled ridges forming a slanted grating of a slanted grating metasurface may be rounded. As another example, an elongated angled ridge described as having a right-angle triangular cross-section with a height face extending perpendicular to a base face is understood to encompass a height face that is not perfectly planar and/or that extends quasi-perpendicular from the base face, based on the limitations of fabrication at the nanometer scale. For example, depending on the specific limitations of manufacturing and fabrication processes utilized, an elongated angled ridge having a triangular cross-section may have a height face that is modeled as or approximates being perpendicular to a base face (e.g., 90 degrees) even though the actual angle may measure between 70 and 110 degrees and/or exhibit some nonuniformity between different elements in the same array.

The presently described metasurfaces, including variously described metasurface couplers, can be fabricated or otherwise manufactured using any of a wide variety of nanofabrication techniques, various materials, various deposition and etching processes, nanofeature lithography techniques, and the like. One example of a method to manufacture a metasurface coupler on a glass or sapphire waveguide substrate includes an initial deposition of a silicon nitride layer directly on a planar face of the waveguide substrate. In such an embodiment, the optical radiation is anticipated to be received through an opposing planar face of the waveguide substrate. A conductive layer, such as a metal layer or doped semiconductor layer, is then deposited on the silicon nitride to facilitate electron beam lithography.

The conductive layer is coated with a photoresist, such as a negative tone deep-ultraviolet (DUV) photoresist like ma-N series photoresists. The photoresist is processed (patterned, developed, and/or etched or otherwise removed) to define a plurality of elongated rectangular polyhedrons of photoresist (e.g., elongated rectangular cuboids of photoresist) that extend perpendicular to a length dimension of the waveguide substrate. For example, electron beam lithography may be used to pattern a photoresist. The undeveloped negative photoresist (or developed photoresist in the case of positive photoresists) is removed to reveal elongated rectangular cuboids of developed photoresist that each have a width between 70 and 130 nanometers and are spaced from one another by a spacing gap between 300 and 400 nanometers.

The portions of the conductive layer between the elongated rectangular cuboids are exposed once the undeveloped photoresist is removed. The exposed portions of the conductive layer are etched or otherwise removed (e.g., via reactive-ion etching). The exposed silicon nitride layer between the elongated rectangular cuboids of photoresist is etched to a target depth. The remaining photoresist (e.g., the elongated rectangular cuboids of photoresist) is removed to expose the silicon nitride layer in its entirety.

The exposed silicon nitride layer includes a thin base layer of silicon nitride (e.g., nanometers) with a plurality of elongated rectangular ridges of silicon nitride extending therefrom (e.g., extending an additional 70-130 nanometers above the base layer, depending on a target final height to be attained). The spacing between the elongated rectangular ridges of silicon nitride defines the periodicity (e.g., related to the frequency response) of the structures. The elongated rectangular ridges of silicon nitride act as "backstops" for the ion beam milling/etching process, as described below. The silicon nitride layer is milled at an angle using ion beam milling for additive formation of a slanted grating as a one-dimensional array of parallel elongated angled ridges of silicon nitride extending from a slightly thinner remaining base layer of silicon nitride on the waveguide substrate. The elongated rectangular ridges of silicon nitride act as backstops during the ion beam milling process to capture removed silicon nitride from the base layer, resulting in the formation of elongated angled ridges of silicon nitride.

A metallic layer is deposited on the upper exposed surfaces of the elongated angled ridges. In some embodiments, the metallic layer may include a relatively thick optically reflective metal layer (e.g., at least 100 nanometers thick). The optically reflective metal layer may include various combinations of noble metals, such as silver (Ag), gold (Au), aluminum (Al), and/or any other materials that are highly reflective at operational wavelengths. In some embodiments, the metallic layer may further include a relatively thin adhesion metallic layer (e.g., between 1 and 5 nanometers thick) positioned between the optically reflective metal layer and the elongated triangular ridges of silicon nitride to reduce delamination of the metallic layer from the silicon nitride. Examples of suitable materials for such an adhesion layer include, but are not limited to, titanium (Ti) and chromium (Cr).

Notably, the example process described above utilizes ion beam etching or milling at an angle as part of an additive process. Ion beam etching is traditionally used to remove material, as implied by the name including "etching" or "milling." The presently described method of fabrication utilizes ion beam etching to remove some silicon nitride material from the base layer between two elongated rectangular ridges of silicon nitride for immediate relocation of at least some of the removed material against the vertical face of one of the elongated rectangular cuboids. As illustrated in the figures and described in greater detail below, the removed and relocated silicon nitride material forms a sloped surface against the elongated rectangular cuboid of silicon nitride, such that the elongated rectangular cuboids of silicon nitride become elongated angled ridges of silicon nitride having a cross-section approaching a triangle, or more specifically in some embodiments, a right triangle, and are elongated along the width of a waveguide.

Whereas ion beam etching is typically considered a removal process, utilizing an ion beam etching process at an angle with respect to and within the nanometer-scale valleys defined between adjacent nanometer-scale ridges results in an unconventional additive process. Additionally, the angle at which the ion beam etches the silicon nitride is inversely proportional to the target internal angle of the angled face or, in the case of an elongated angled ridge with a cross-section approximating a right triangle, the hypotenuse face.

An understanding of traditional optical lenses may be helpful to understand the possible applications and functions of various embodiments and applications of the metasurfaces described herein. Traditional optical lenses and mirrors (e.g., glass or acrylic) are formed with a curvature to modify the optical path of incident optical radiation. Multiple lenses and/or mirrors may be combined with various indices of refraction, curvatures, coatings, and other features to achieve specific optical deflection (refraction or reflection) goals.

Figure 1B:
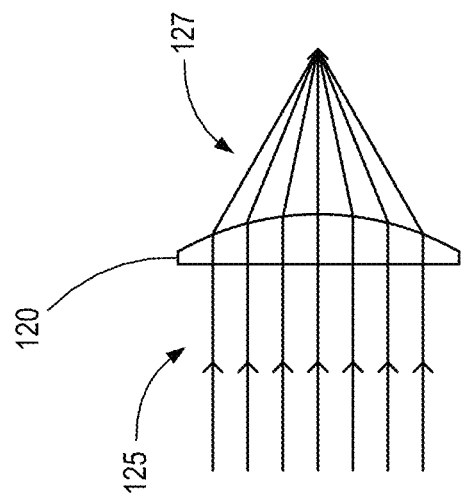
Figure 1A:
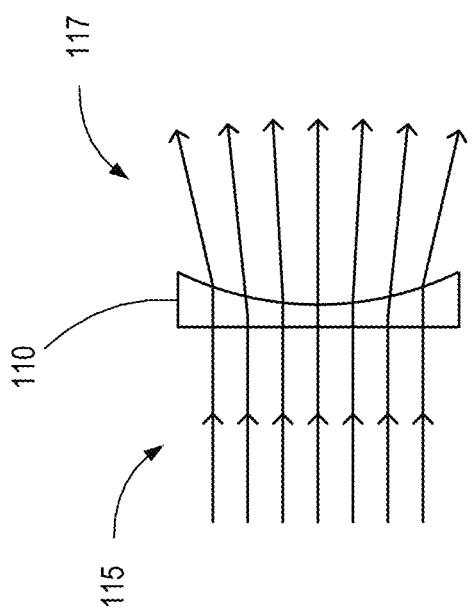

FIGS. 1A-1C illustrate examples of optical paths through concave, convex, and flat plate optical lenses 110, 120, and 130, respectively. Specifically, FIG. 1A illustrates an example of a concave lens 110 that receives incident optical radiation 115 that is deflected as divergent optical radiation 117. FIG. 1B illustrates incident optical radiation 125 that converges as converging optical radiation 127 as it passes through the convex lens 120.

FIG. 1C illustrates incident optical radiation 135 incident at an angle relative to a planar surface of a flat plate optical lens 130. An output optical radiation 137 is shifted as it passes through the flat plate optical lens 130. The degree or amount of phase shift is based on a difference between the refractive index of surrounding media (e.g., air, water, waveguide, etc.) and the refractive index of the flat plate optical lens 130. Convex, concave, and other shapes of mirrors can be used to achieve other manipulations of incident optical radiation.

Metamaterial-based lenses and mirrors may be formed as relatively thin (e.g., <1 mm) elements that provide controlled deflection without curved surfaces. As described herein, a substrate surface may be configured to allow optical radiation to pass through or to reflect optical radiation therefrom. Subwavelength-scale features (e.g., pillars, gratings, etchings, slots, grooves, gaps, cavities, etc.) may be patterned on a surface of the substrate to deflect incident optical radiation in a controlled manner to obtain a target optical radiation output at various output angles (e.g., between 0° to 180°). In some embodiments, subwavelength-scale features may be formed on more than one surface of the substrate. For example, subwavelength-scale features may be formed on one or both sides of a substrate. A metasurface may be used to deflect (e.g., focus, collimate, diverge, scatter, etc.) optical radiation within free space (e.g., air) or to couple optical radiation between free space and another medium, such as a waveguide, traditional optical lenses, a fiber optic transmission line, or the like.

In some embodiments, a metasurface may be used in place of injection optics for a laser-based scanning illumination engine or LED microdisplay coupled to a waveguide. The metasurface may be used to efficiently deflect incident optical radiation from a laser source into a waveguide for total internal reflection.

Variations of the systems and methods described herein may be used or adapted for use in near-to-eye (NTE) displays, such as NTE displays used in wearable technology, smart glasses, augmented reality headsets, virtual reality headsets, heads-up displays, and the like. For example, a metasurface may be used as part of an NTE display to collimate optical radiation into parallel rays for delivery to the eye of the user at "infinite focus." Similarly, a metasurface may be used as part of an NTE display to deliver optical radiation to the eye of the user at target angles that vary spatially along the surface of the metasurface to cause an image to appear to originate from one or more target focal depth plane(s). In some embodiments, the optical radiation may be covered at multiple different depth planes to map the output optical radiation onto the physical world and/or to relieve eye fatigue (i.e. vergence-accommodation conflict or VAC).

In other embodiments, a metasurface may be used as part of an NTE display to duplicate source images and cause the duplicated source images to appear as if they originate from different positions in the visual field, for example, to facilitate pupil replication or expansion of an effective "eyebox" of the NTE display. The metasurface may be used to expand the source image of an NTE display to have a wider range of divergence angles (e.g., act as an expander) to provide a wider effective field of view.

Variations of the systems and methods described herein may be used or adapted for use in light-field displays. As used herein, the term "light-field display" is used to describe any of a wide variety of displays using various technologies to render a three-dimensional image field to one or more users without the use of polarized or active-shutter glasses. Light-field displays deliver an image to each eye of the user at slightly different perspectives to provide binocular disparity for depth perception. The different images transmitted to the eyes of the user cause the user to perceive the image as a three-dimensional image. As an example, a lenticular lens overlaid on a digital display may be used to deliver different images to each eye of the user. Three-dimensional displays using lenticular lens technology have fundamentally limited fields of view.

The presently described systems and methods relating to metasurfaces are suitable to create advanced light-field displays that can be viewed from different perspectives simultaneously by multiple users. Similarly, metasurfaces can be used to create advanced light-field displays that deliver an image from different perspectives as a single user moves through the visual field. The metasurfaces may deliver variations of an image to different spatial locations within the visual field to provide the user with a natural-appearing three-dimensional image that accounts for motion, parallax, occlusion, and/or accommodation.

Some three-dimensional displays use a two-dimensional array of microlenses (e.g., a microlens array or MLA) with lenslets that span multiple pixels of the underlying electronic display. In such embodiments, the microlenses cause the user to perceive only one of the underlying pixels based on the position of the user's eye relative to each respective lenslet. The metasurface-based approaches described herein avoid undesirable field-of-view, reduced fill factor, and other optical deficiencies fundamentally associated with microlens solutions. Specifically, three-dimensional displays utilizing metasurfaces to deliver different images (e.g., different perspectives of an image) to different locations within the visual field provide an improved optical performance, a finer pitch, near 100% fill factor, and a lower profile than comparable microlens-based solutions.

According to various embodiments, the metasurfaces described herein may be fabricated using any of a wide variety of suitable manufacturing techniques, including without limitation nanoimprinting manufacturing techniques, complementary metal-oxide-semiconductor (CMOS) fabrication techniques, and/or deep or extreme ultraviolet (DUV or EUV) lithography processes. For example, such processes may be used to fabricate the material layers herein that form an array of etchings, gaps, pillars, slots, channels, grooves, or other deflector elements.

In various embodiments, an array of polarization-independent, passive deflector elements is patterned on a substrate through which optical radiation passes (transmission mode) or from which optical radiation is reflected (reflection mode). The passive deflector elements may be adapted to deflect a relatively narrow band of coherent optical radiation (e.g., from a laser light source) in a prescribed direction, arbitrarily based on the origin of the optical radiation (e.g., pixel-by-pixel variation), and/or collimated to provide an effective "infinite focus."

The generalized descriptions of the systems and methods herein may be utilized and/or adapted for utilization in a wide variety of industrial, commercial, and personal applications. Similarly, the presently described systems and methods may be used in conjunction with or utilize existing computing devices and infrastructures. Some of the infrastructure that can be used with embodiments disclosed herein is already available, such as general-purpose computers, computer programming tools and techniques, digital storage media, and communication links. A computing device or controller may include a processor, such as a microprocessor, a microcontroller, logic circuitry, or the like.

A processor may include one or more special-purpose processing devices, such as application-specific integrated circuits (ASICs), a programmable array logic (PAL), a programmable logic array (PLA), a programmable logic device (PLD), a field-programmable gate array (FPGA), or another customizable and/or programmable device. The computing device may also include a machine-readable storage device, such as non-volatile memory, static RAM, dynamic RAM, flash memory, or another machine-readable storage medium. Various aspects of certain embodiments may be implemented using hardware, software, firmware, or a combination thereof.

The components of the disclosed embodiments, as generally described and illustrated in the figures herein, could be arranged and designed in a wide variety of different configurations. Furthermore, the features, structures, and operations associated with one embodiment may be applied to or combined with the features, structures, or operations described in conjunction with another embodiment. In many instances, well-known structures, materials, or operations are not shown or described in detail to avoid obscuring aspects of this disclosure. The embodiments of the systems and methods provided within this disclosure are not intended to limit the scope of the disclosure but are merely representative of possible embodiments. In addition, the steps of a method do not necessarily need to be executed in any specific order or even sequentially, nor do the steps need to be executed only once, unless the context or express statements dictate otherwise.

Figures 2A, 2B:
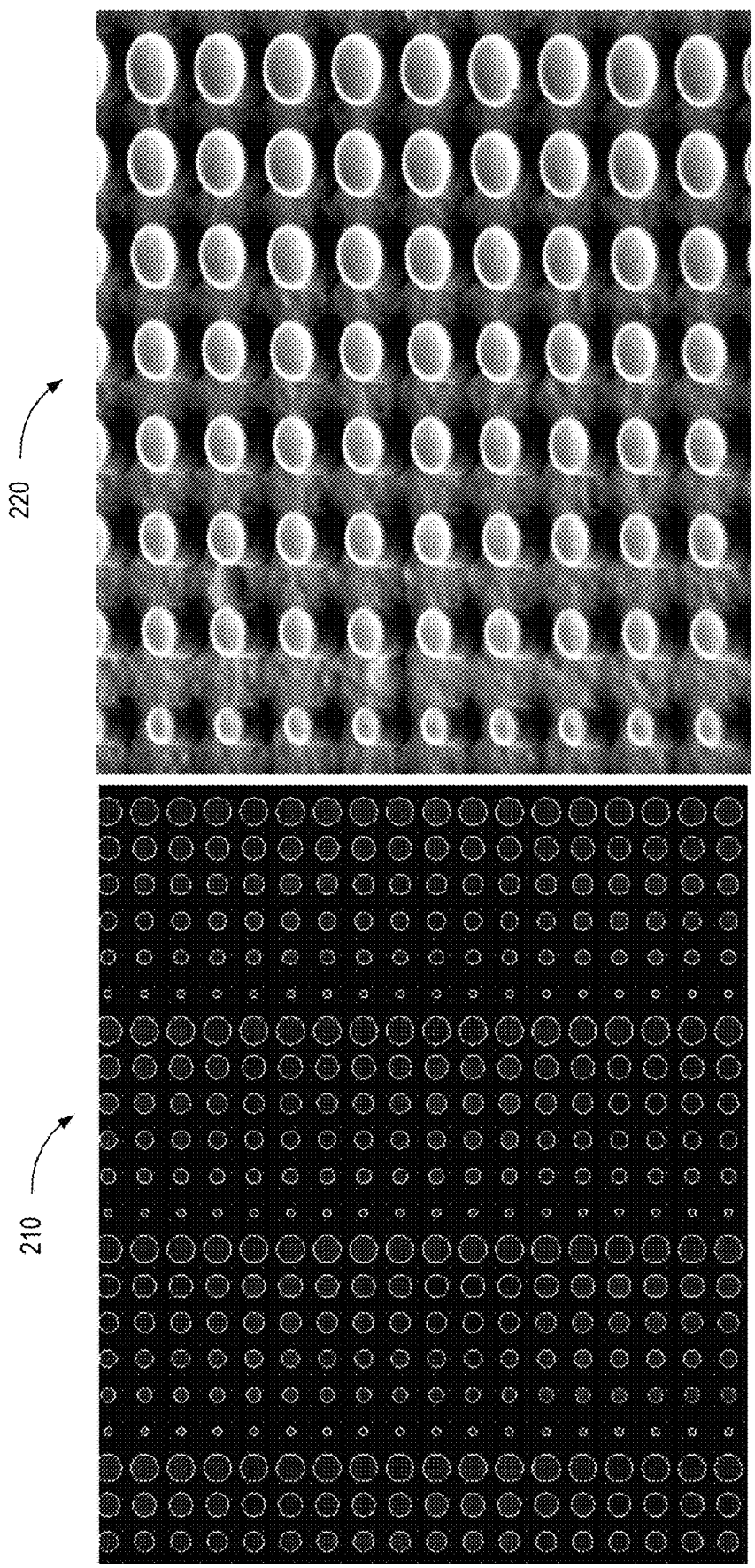
FIG. 2A illustrates a top-down view of an example representation of a pattern of deflector elements for a metasurface structure, according to one embodiment.
FIG. 2B illustrates an enlarged perspective view of the example representation of the pattern of deflector elements in the metasurface of FIG. 2A, according to one embodiment.

FIG. 2A illustrates a top-down view of an example representation of a pattern of deflector elements 210 for a metasurface structure, according to one embodiment. As illustrated, a uniform square grid of deflector elements 210 may pattern the deflector elements 210 with uniform spacings between adjacent or nearest neighbor deflector elements. Moreover, the deflector elements 210 may be configured with uniform heights. In the illustrated example, the deflector elements 210 comprise circular pillars arranged in a repeating pattern of pillar diameters.

FIG. 2B illustrates an enlarged perspective view of the example representation of the pattern of deflector elements in the metasurface of FIG. 2A, according to one embodiment. As illustrated, an array of deflector elements 220 includes a uniformly spaced arrangement of circular pillars (e.g., cylinders) extending from a substrate. The deflector elements 220 have different pillar diameters that increase along one dimension (left to right) and are constant along the other dimension (top to bottom). Alternative patterns of pillar diameters may be used to achieve target deflection patterns.

Figure 3A:
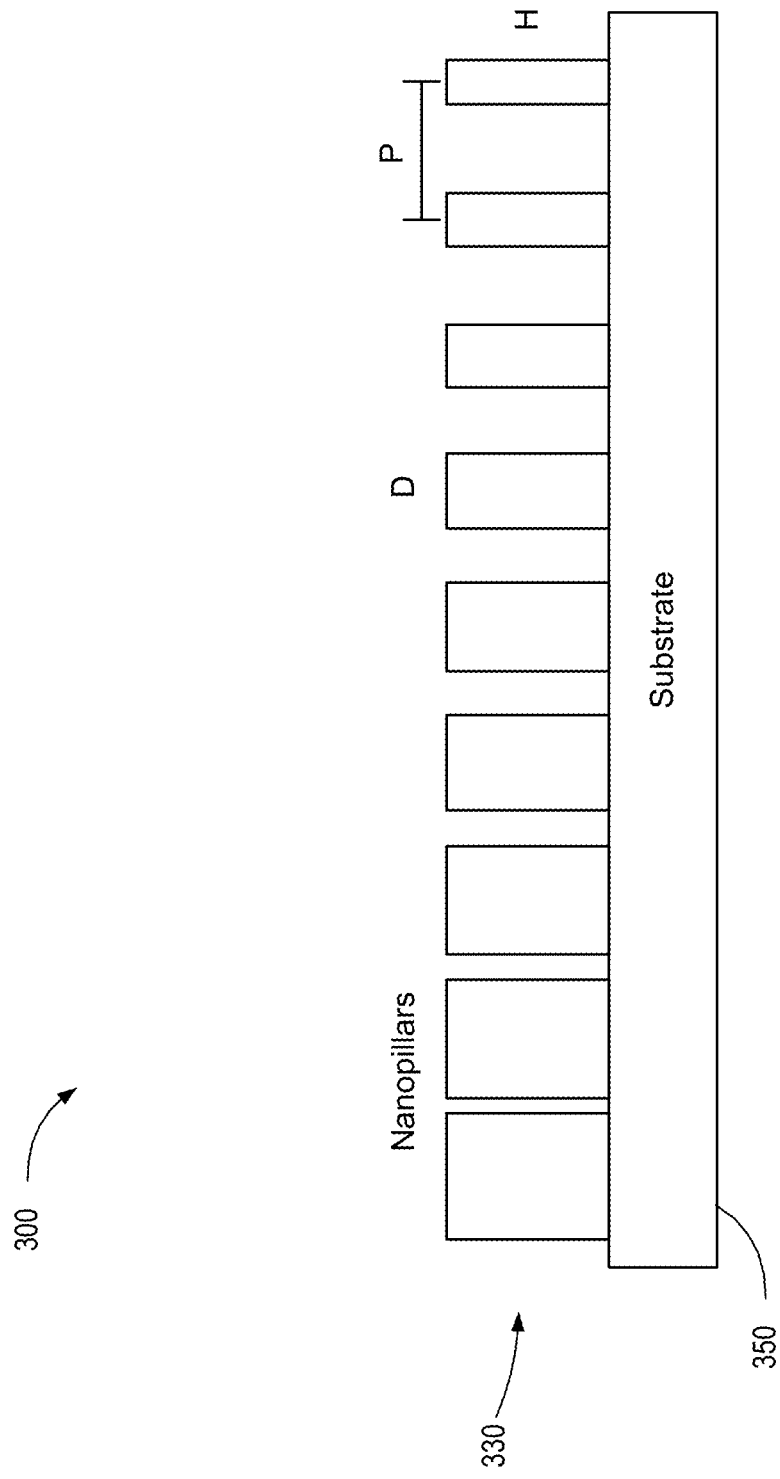
FIG. 3A illustrates an example block diagram of a side view of a metasurface with nanopillar deflectors positioned on a substrate, according to one embodiment.

FIG. 3A illustrates an example block diagram of a side view of a metasurface 300 with nanopillar deflector elements 330 positioned on a substrate 350, according to one embodiment. As illustrated, the nanopillar deflector elements 330 may have a uniform height, H, and varying diameters, D. In the illustrated example, the nanopillar deflector elements 330 are evenly spaced with a nearest neighbor on-center spacing distance, P. The spacing between the centers of adjacent or nearest neighbor nanopillars may be constant despite the varying diameters of the pillars. As described herein, the dimensions, patterns, and spacings of the nanopillars are selected to achieve a target deflection pattern (e.g., angle of deflection) and frequency response (e.g., target operational bandwidth of optical radiation).

Figure 3B:
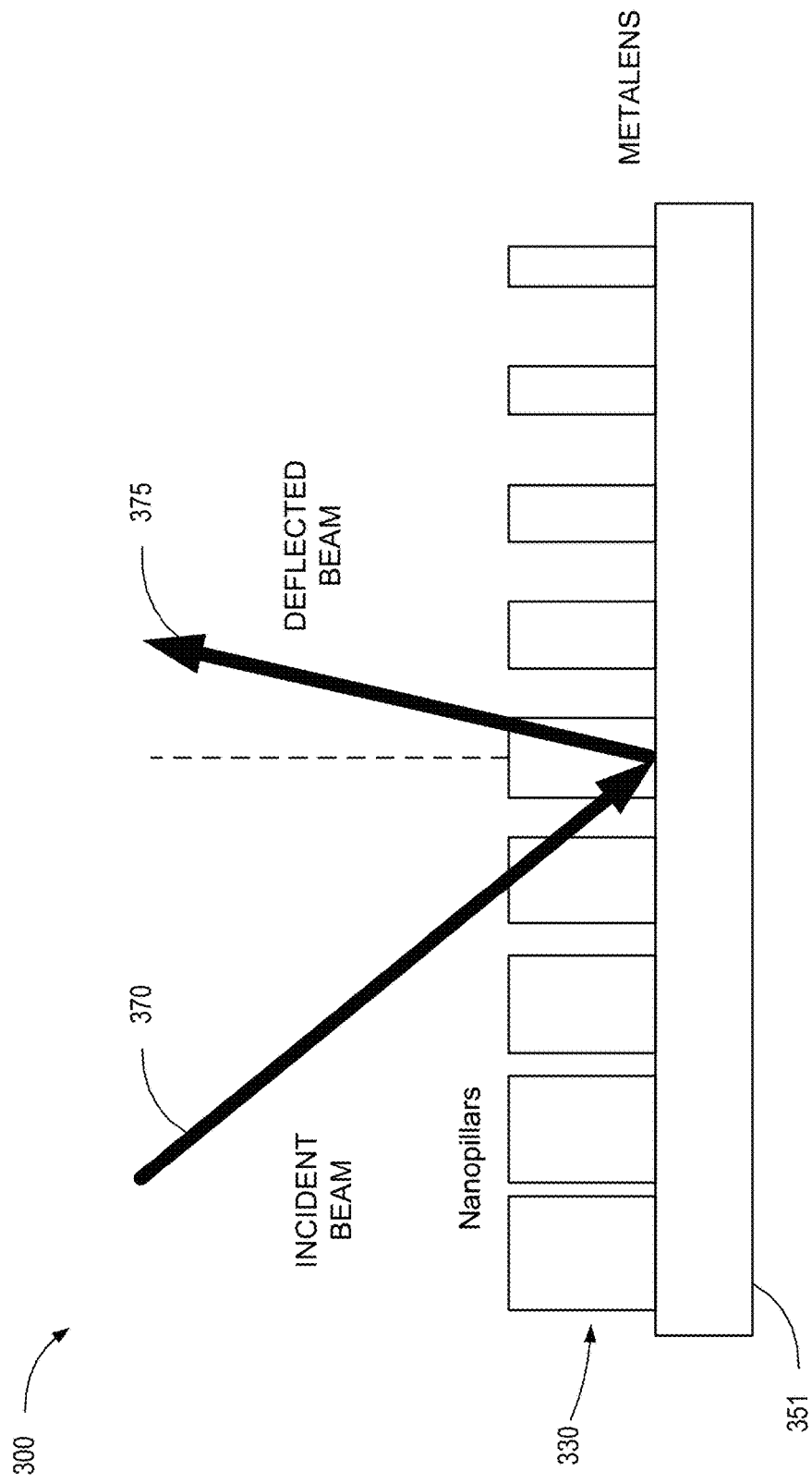
FIG. 3B illustrates the example block diagram of the metasurface of FIG. 3A operating to reflect incident optical radiation, according to one embodiment.

FIG. 3B illustrates the example block diagram of the metasurface 300 of FIG. 3A operating to reflect incident optical radiation 370 as deflected optical radiation 375 at a target deflection angle, according to one embodiment. In the illustrated embodiment, the substrate 351 is a reflective substrate and/or the substrate 351 includes a reflective layer. The metasurface may operate to focus the optical radiation and may be referred to as a metalens.

Figure 3C:
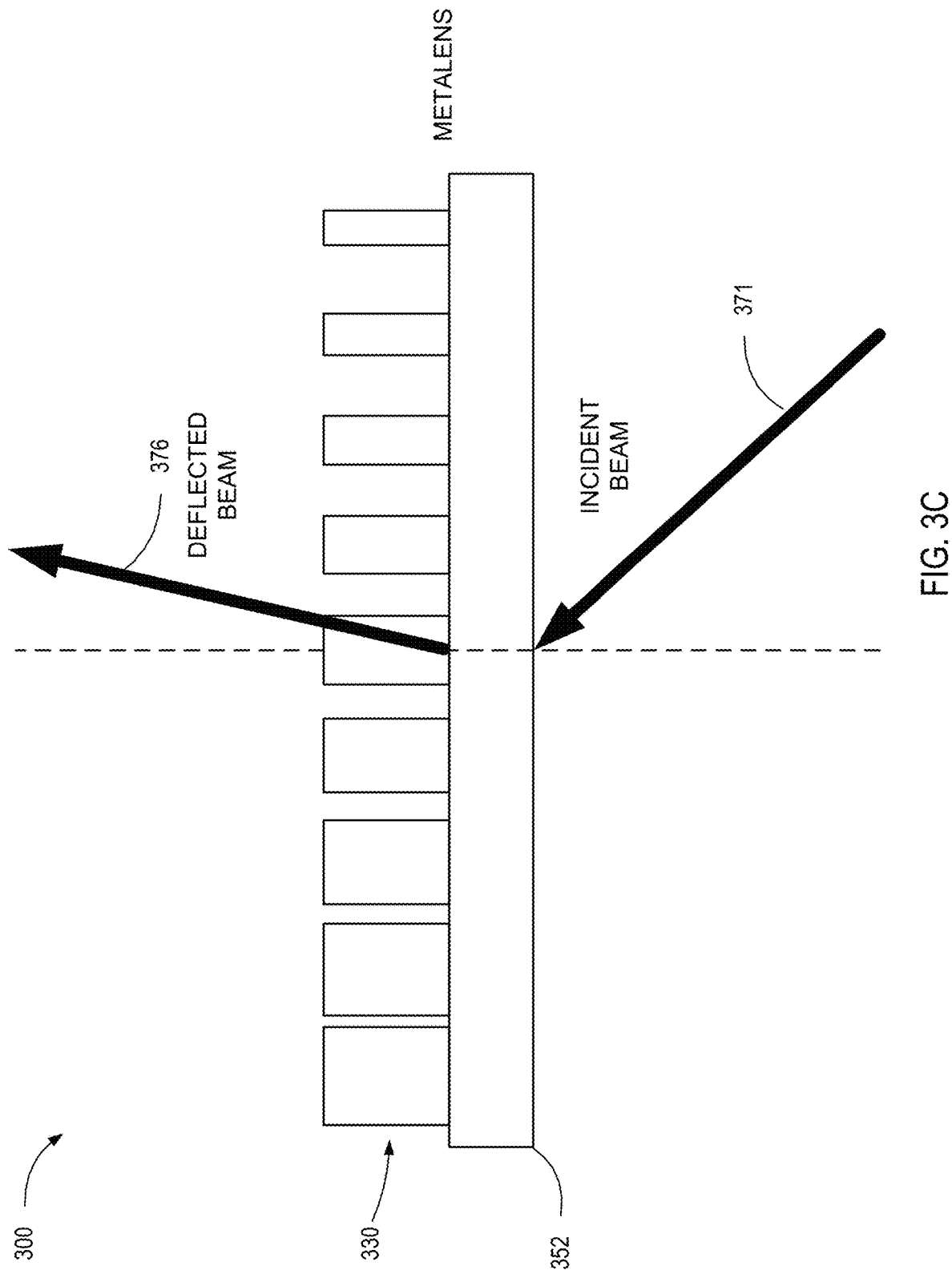
FIG. 3C illustrates the example block diagram of the metasurface of FIG. 3A steering incident optical radiation, according to one embodiment.

FIG. 3C illustrates the example block diagram of the metasurface 300 of FIG. 3A steering incident optical radiation 371 as deflected optical radiation 376 at a target deflection angle, according to one embodiment. In the illustrated embodiment, the optical radiation passes through substrate 352. In some instances, the transmission-mode substrate 352 may include one or more index-matching layers to improve transmittance efficiency.

FIGS. 4A-4B illustrate metasurfaces used in conjunction with laser-scanning subsystems, according to various embodiments. As illustrated and labeled, a laser source 450 may transmit coherent optical radiation to a scanning mirror 440 that is mechanically moved between a first position and a second position to scan the laser along one dimension (left to right on the page). In some embodiments, two mirrors are used (one fast and one slow) on orthogonal axes to raster an image. In FIG. 4A, optical radiation 410 from the laser source 450 is incident on the left side of a metasurface 400 at a first angle of incidence when the scanning mirror 440 is rotated counterclockwise (shown in solid lines). Optical radiation 410 from the laser source 450 is incident on the right side of the metasurface 400 at a second angle of incidence when the scanning mirror 440 is rotated clockwise (shown in dashed lines).

As illustrated, the metasurface 400 may be configured to deflect the incident optical radiation as collimated optical radiation 420 that transmits in a uniform direction along the length of the metasurface 400. In such an embodiment, an array of deflector elements may be patterned on a substrate with dimensions, spacings, and heights to compensate for the different angle of incidence of the optical radiation 410 as the scanning mirror 440 is rotated.

In an alternative embodiment illustrated in FIG. 4B, the metasurface 400 may comprise an array of deflector elements patterned on a substrate with dimensions, spacings, and heights to transmit output optical radiation 410 at different exit angles 420 and 421 depending on the location at which the optical radiation 410 was received. The effective deflection pattern of the metasurface 400 may be selected to achieve a target optical objective, such as forming multiple depth planes, pupil replication, or expansion of a viewing eyebox.

Figure 5A:
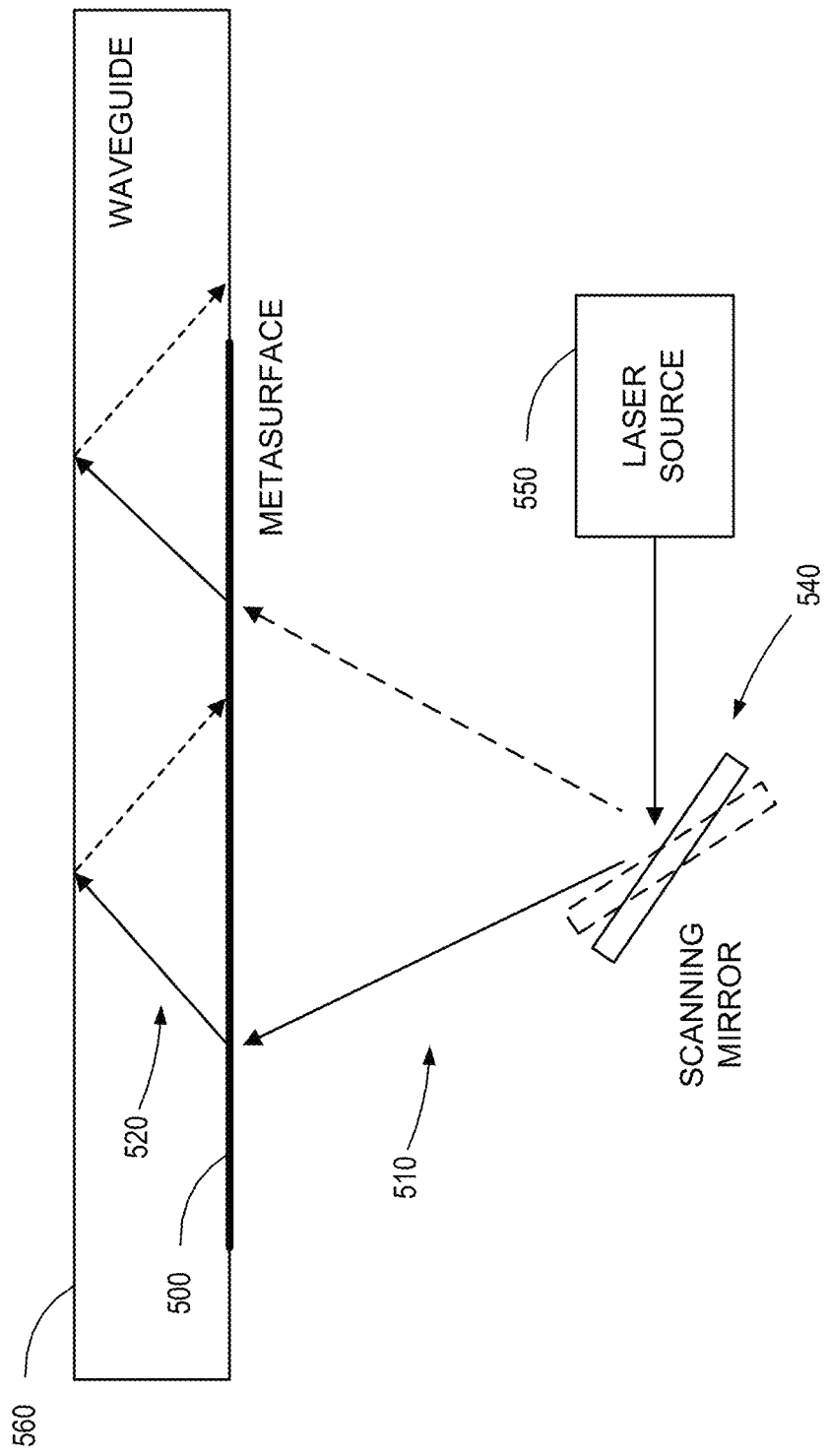
FIG. 5A illustrates an example system with a metasurface and waveguide used in conjunction with a laser scanning subsystem, according to one embodiment.

FIG. 5A illustrates an example system with a metasurface 500 and waveguide 560 used in conjunction with a laser scanning subsystem that includes a laser source 550 and a scanning mirror 540, according to one embodiment. According to the illustrated embodiment, the metasurface 500 may provide the equivalent functionality of injection optics in a laser-scanning illumination engine. In some embodiments, the metasurface 500 (or just the array of deflector elements) may be directly fabricated on or in a waveguide substrate. Given the subwavelength thickness of the metasurface 500, the system may be much more compact and/or efficient than a similar system using traditional injection optics.

The metasurface 500 deflects received optical radiation 510 into the waveguide 560 for total internal reflection and/or transmission, at 520, as guided optical radiation along the length of the waveguide 560. In the illustrated embodiment, the optical radiation 510 generated by the laser source 550 passes through the metasurface 500 before entering the waveguide 560.

Figure 5B:
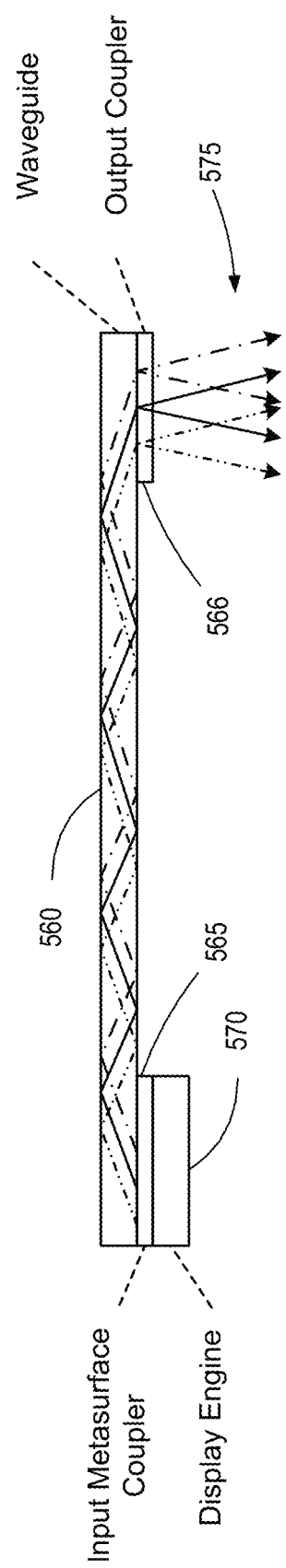
FIG. 5B illustrates an example display system that utilizes input and output metasurfaces in conjunction with a waveguide, according to one embodiment.

FIG. 5B illustrates an example display system that utilizes an input metasurface coupler 565 and an output metasurface coupler 566 in conjunction with a waveguide 560, according to one embodiment. A display engine 570 generates optical radiation as part of an RGB display (e.g., via an LED array of RGB pixels). The input metasurface coupler 565 couples the generated RGB optical radiation for transmission along the length of the waveguide 560. The output metasurface coupler 566 receives the transmitted optical radiation and decouples the optical radiation from the waveguide 560 for visualization by a user (e.g., via frequency-selective focusing to a target plane), at 575. In the illustrated embodiment, the optical radiation generated by the display engine 570 passes through the input metasurface coupler 565 before entering the waveguide 560.

Figure 6A:
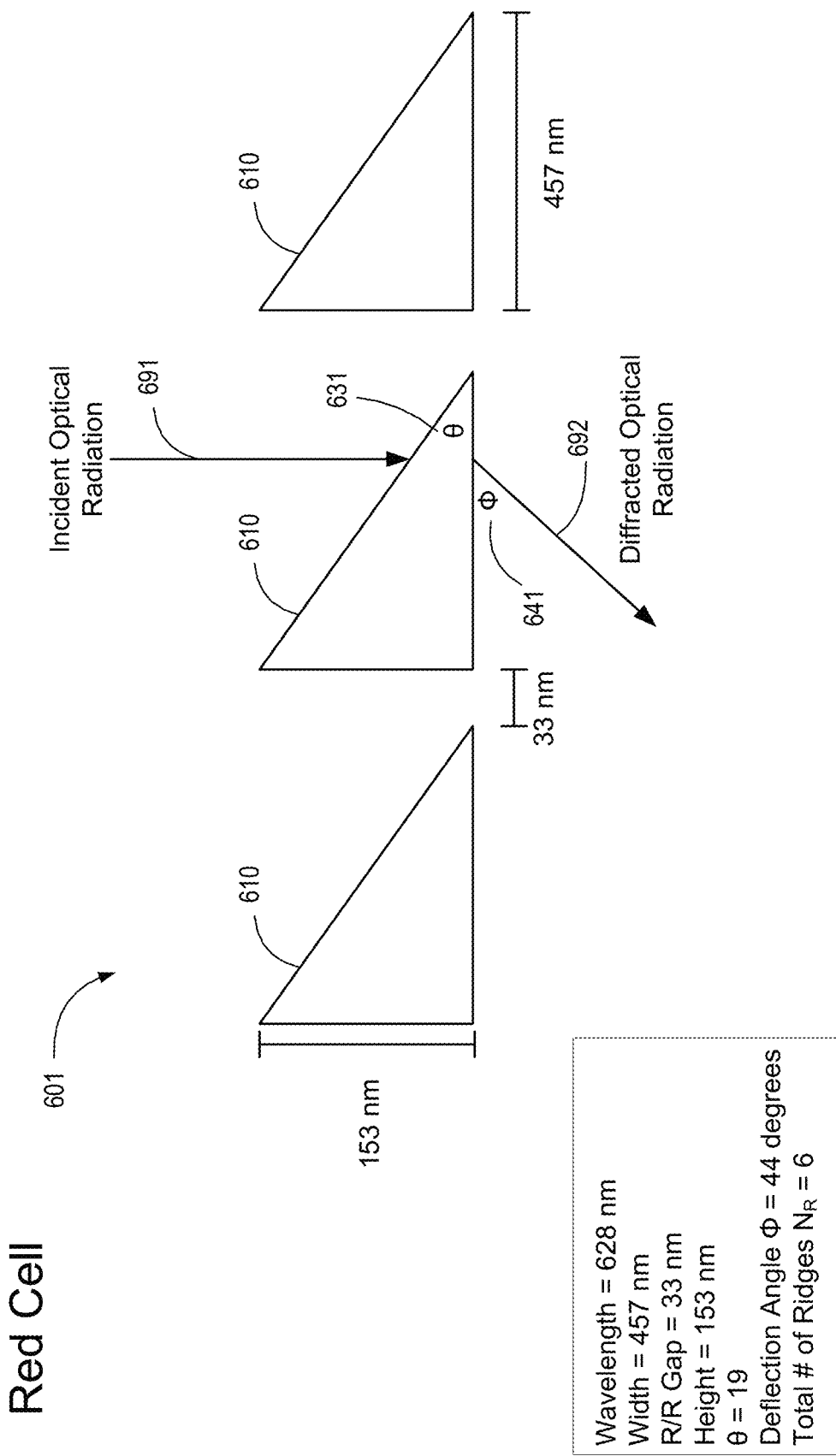
FIG. 6A illustrates an example of a cell of a metasurface for red optical radiation, according to one embodiment.

FIG. 6A illustrates a cross-sectional view of a portion of a cell 601 of a metasurface for red optical radiation (e.g., having a wavelength of 628 nanometers), according to one embodiment. The cross-sectional view includes three angled ridges 610 fabricated with gaps between adjacent angled ridges. In the illustrated example, the spacing between adjacent elements is 33 nanometers. The angled ridges 610 represent cross-sections of elongated angled ridges that form a slanted grating metasurface for the red optical radiation, as described and illustrated in conjunction with FIGS. 7A and 7B below. In various embodiments, the angled ridges 610 may be fabricated using polysilicon, amorphous silicon, silicon nitride, titanium dioxide, lithium niobate, polysilicon, and/or combinations thereof.

In the illustrated example, each angled ridge 610 is a right triangle with a height of 153 nanometers and a base width of 457 nanometers. The internal angle between the hypotenuse of each angled ridge 610 and the base is approximately 19 degrees, at 631. Optical radiation is incident, at 691, on the cell 601 an angle of incidence substantially perpendicular to the base. While only three angled ridges 610 are illustrated, the cell 601 for red optical radiation includes, in some embodiments, six (6) ridges that operate to deflect the optical radiation at a deflection angle of approximately 44 degrees, at 692.

Each angled ridge 610 is sub-wavelength in dimension with a base width smaller than the operational wavelength. The gap between adjacent angled ridges 610 is approximately 33 nanometers, such that red cell 602 has a total width dimension of approximately 3.2 micrometers. Different dimensions and gap spacing may be used for different wavelengths of optical radiation. For example, for red optical radiation having a wavelength between approximately 600 and 700 nanometers, angled ridges may be utilized that have heights between 125 and 175 nanometers, base widths between 400 and 500 nanometers, and inter-ridge gaps between 0 and 50 nanometers. The angle 631 of the hypotenuse face of each angled ridge relative to the base face may be adjusted between approximately 15 degrees and 25 degrees based on the wavelength of optical reflection to be deflected and the target angle of deflection.

Additionally, depending on the specific dimensions of the angled ridges, the gaps between them, and the material utilized, the angle of deflection, at 641, may vary between approximately 35 degrees and 55 degrees. A target angle of deflection may be selected to ensure that the transmitted optical radiation enters an optical waveguide and is transmitted therein at an angle less than a critical angle, resulting in total internal reflection (TIR) within the waveguide.

Figure 6B:
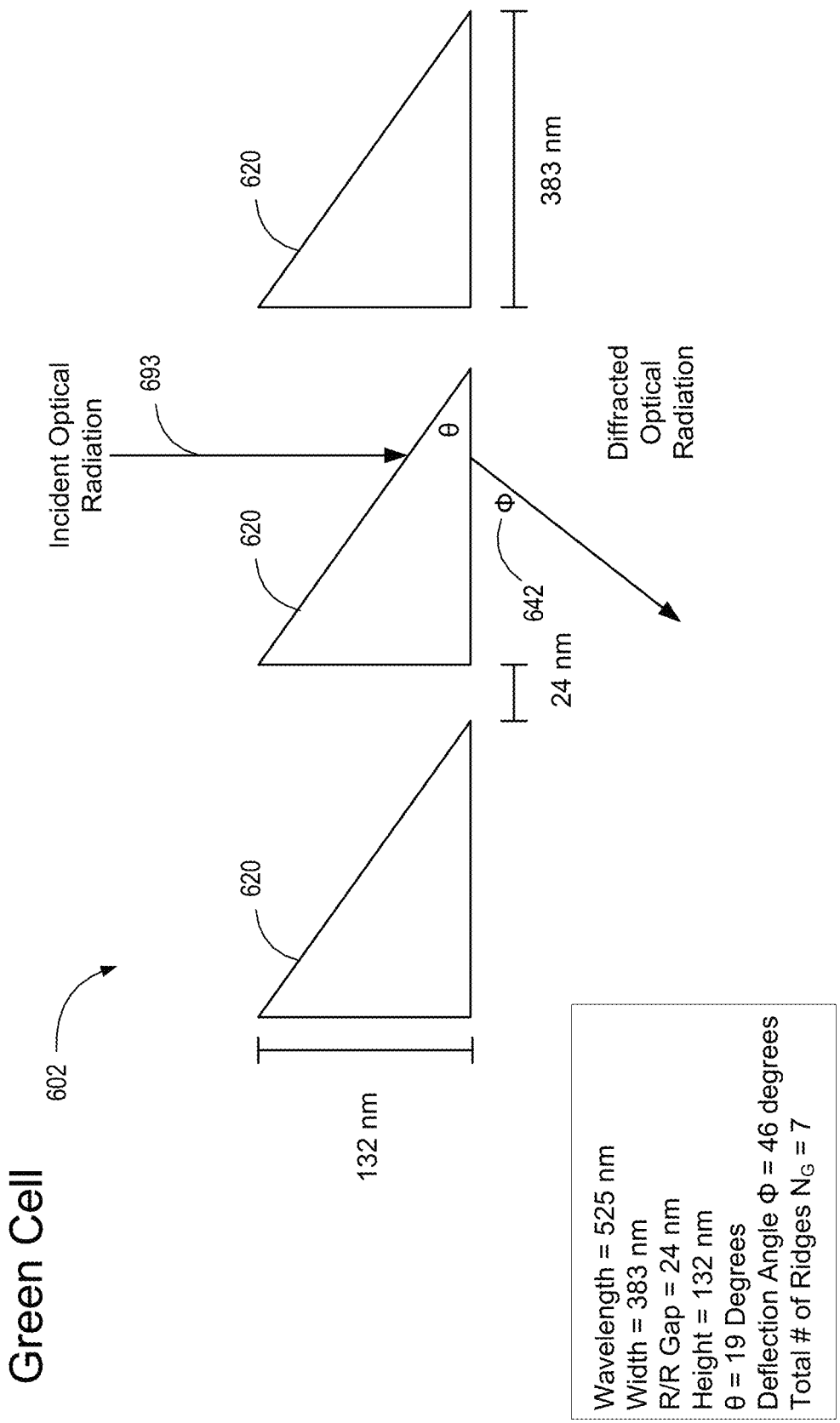
FIG. 6B illustrates an example of a cell of a metasurface for green optical radiation, according to one embodiment.

FIG. 6B illustrates a cross-sectional view of a portion of a cell 602 of a metasurface for green optical radiation (e.g., having a wavelength of 525 nanometers), according to one embodiment. Again, the illustrated angled ridges 620 represent cross-sections of the three-dimensional elongated angled ridges that form the slanted grating of a metasurface for green optical radiation. Each angled ridge 620 is a right triangle with a height of 132 nanometers and a base width of 383 nanometers, which is less than an operational wavelength of green optical radiation at 525 nanometers. The hypotenuse of each angled ridge 620 is at an angle of approximately 19 degrees relative to the base. Incident optical radiation, at 693, is deflected at a deflection angle, at 642, of approximately 46 degrees.

The cell 602 of the metasurface for green optical radiation may include seven ridges for green light having a wavelength of approximately 525 nanometers. A gap between adjacent angled ridges is illustrated as approximately 24 nanometers, such that green cell 602 has a total width dimension of approximately 3.2 micrometers. Different dimensions and gap spacing may be used for different wavelengths of optical radiation. For example, for green optical radiation having a wavelength between approximately 495 and 570 nanometers, angled ridges may be utilized that have heights between 110 and 150 nanometers, base widths between 350 and 450 nanometers, and inter-ridge gaps between 0 and 40 nanometers.

The angle of the hypotenuse face of each angled ridge relative to the base face may be adjusted between approximately 15 degrees and 25 degrees to achieve the target deflection angle, at 642, of incident optical radiation, at 693. Additionally, depending on the specific dimensions of the angled ridges, the gaps between adjacent angled ridges, and the material utilized, the angle of deflection may vary between approximately 35 degrees and 55 degrees.

Figure 6C:
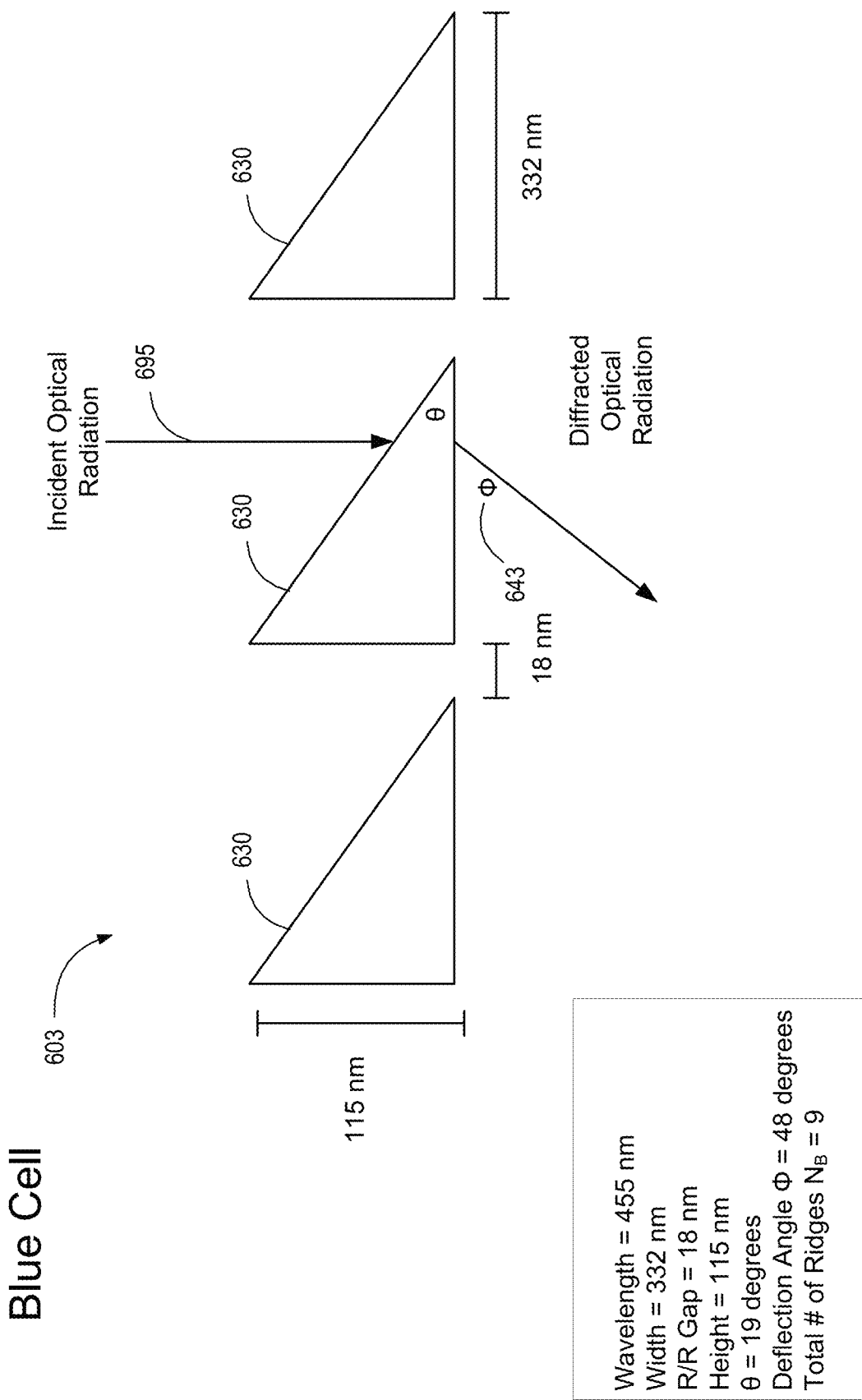
FIG. 6C illustrates an example of a cell of a metasurface for blue optical radiation, according to one embodiment.

FIG. 6C illustrates a cross-sectional view of a portion of a cell 603 of a metasurface for blue optical radiation (e.g., having a wavelength of 455 nanometers), according to one embodiment. Again, the illustrated angled ridges 630 represent cross-sections of three-dimensional angled ridges that form the slanted grating of a metasurface for blue optical radiation. Each angled ridge 630 is a right triangle with a height of 115 nanometers and a base width of 332 nanometers, which is less than the operational wavelength of blue optical radiation at 455 nanometers. The hypotenuse of each angled ridge 620 is at an angle of approximately 19 degrees relative to the base. Incident optical radiation, at 695, is deflected at a deflection angle, at 643, of approximately 48 degrees.

The cell 603 of the metasurface for blue optical radiation may include nine angled ridges for blue light having a wavelength of approximately 455 nanometers. A gap between adjacent ridges is illustrated as approximately 18 nanometers, such that blue cell 603 has a total width dimension of approximately 3.2 micrometers. Different dimensions and gap spacing may be used for different wavelengths of optical radiation. For example, for blue optical radiation having a wavelength between approximately 450 and 495 nanometers, angled ridges may be utilized that have heights between 90 and 140 nanometers, base widths between 300 and 400 nanometers, and inter-ridge gaps between 0 and 35 nanometers.

The angle of the hypotenuse face of each angled ridge relative to the base face may be adjusted between approximately 15 degrees and 25 degrees to achieve a target deflection angle, at 643, of incident optical radiation, at 695. Additionally, depending on the specific dimensions of the angled ridges, the gaps between adjacent angled ridges, and the material utilized, the angle of deflection may vary between approximately 30 degrees and 60 degrees.

Figure 7A:
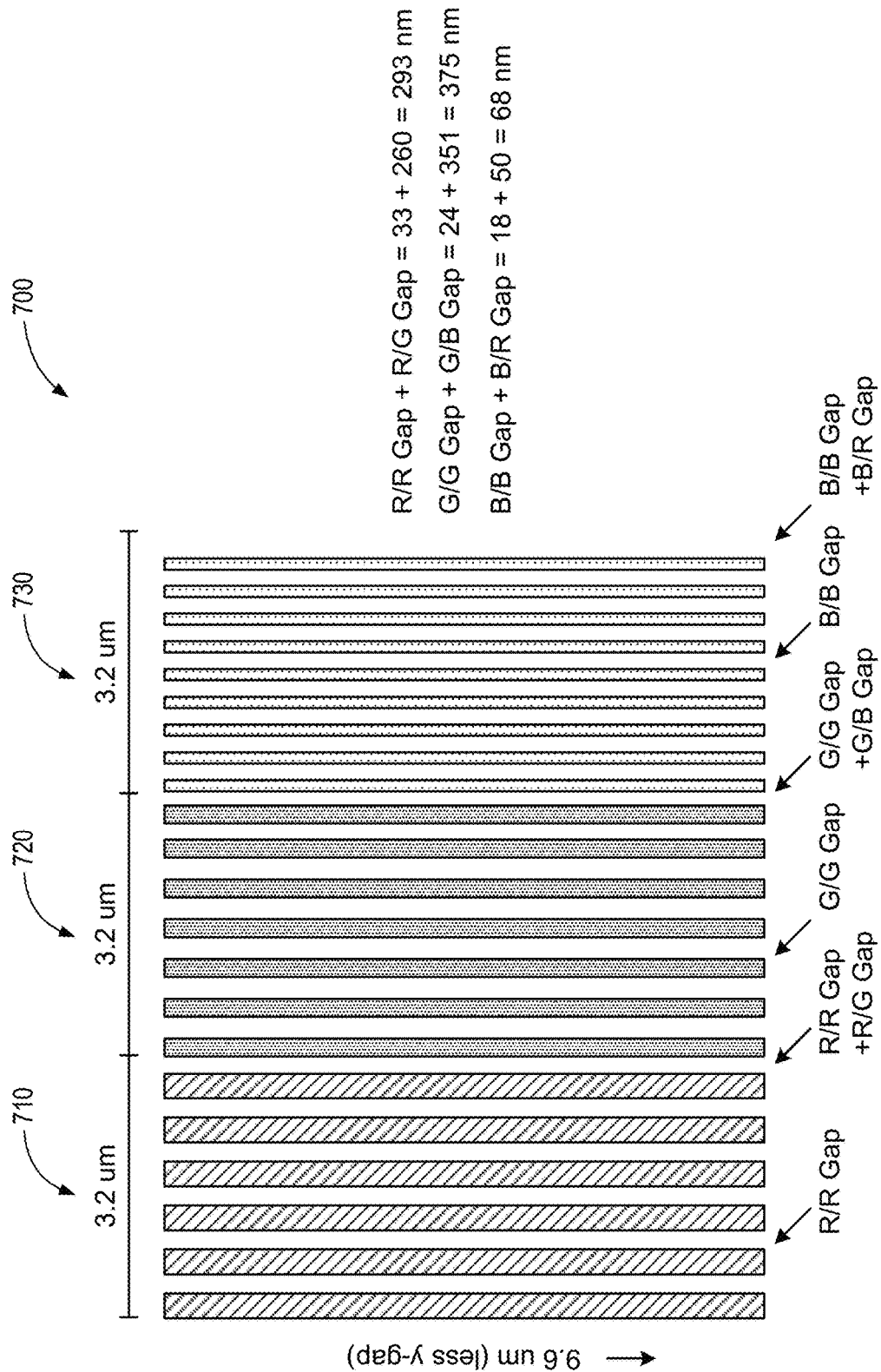
FIG. 7A illustrates an example of a two-dimensional RGB cell of a metasurface, according to one embodiment.

FIG. 7A illustrates a top-down view of an example of a two-dimensional RGB cell 700 of a metasurface, according to one embodiment. The top-down view of the RGB cell 700 includes six red, angled ridges 710, seven green, angled ridges 720, and nine blue, angled ridges 730 that form an RGB cell of a slanted grating metasurface. In the illustrated example, the gap between adjacent red, angled ridges 710 is approximately 33 nanometers. The gap between the adjacent red 710 and green 720 angled ridges is approximately 260 nanometers. The gap between adjacent green, angled ridges 720 is approximately 24 nanometers. The gap between the green 720 and blue 730 angled ridges is approximately 351 nanometers. The gap between adjacent blue, angled ridges 730 is approximately 18 nanometers.

The illustrated RGB cell 700 may be replicated in one or two dimensions to form a one-dimensional array of RGB cells 700 or a two-dimensional array of RGB cells 700. In such embodiments, the gap between the blue, angled ridges 730 and the red triangular ridges may be 50 nanometers. The gap between cells in the other dimension (e.g., the gap between ends of triangular ridges having the same color) may be minimized or spaced according to the underlying light source (e.g., an array of underlying LEDs or OLEDs).

The exact number (and relative numbers) of red, green, and blue angled ridges 710-730 may be modified and vary based on the absolute size and relative sizes of the red, green, and blue subpixels of an underlying display (e.g., based on the pitch and interpixel spacing of the pixels of the display and/or the pitch and inter-subpixel spacing of the subpixels of the display).

Figure 7B:
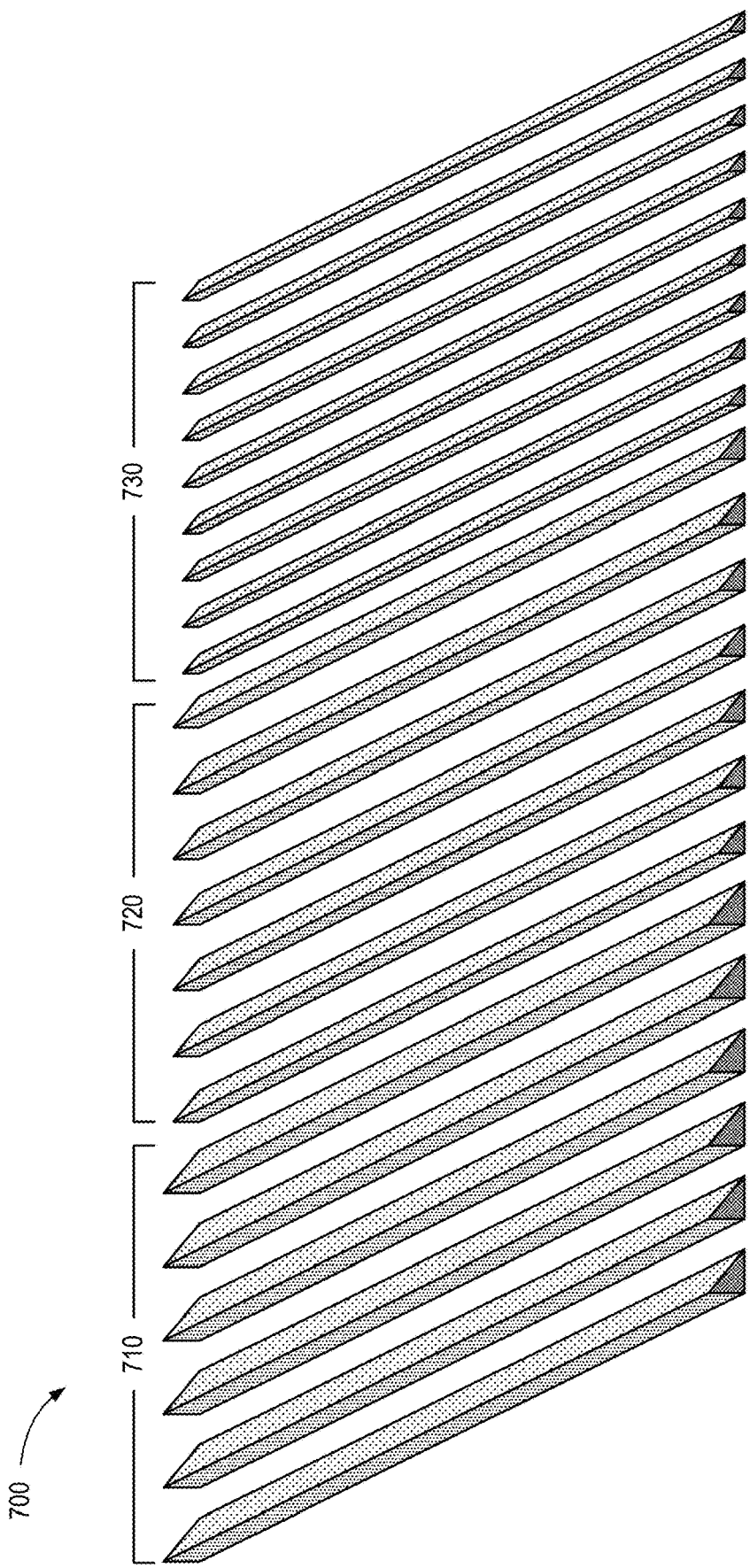
FIG. 7B illustrates a perspective view of a two-dimensional RGB cell of a metasurface, according to one embodiment.

FIG. 7B illustrates a perspective view of a two-dimensional RGB cell 700 of a metasurface, according to one embodiment. In the illustrated embodiment, the first six angled ridges 710 correspond to a red portion of the RGB cell 700. The next seven angled ridges 720 correspond to a green portion of the RGB cell 700. The last nine angled ridges 730 correspond to a blue portion of the RGB cell 700.

Figure 8:
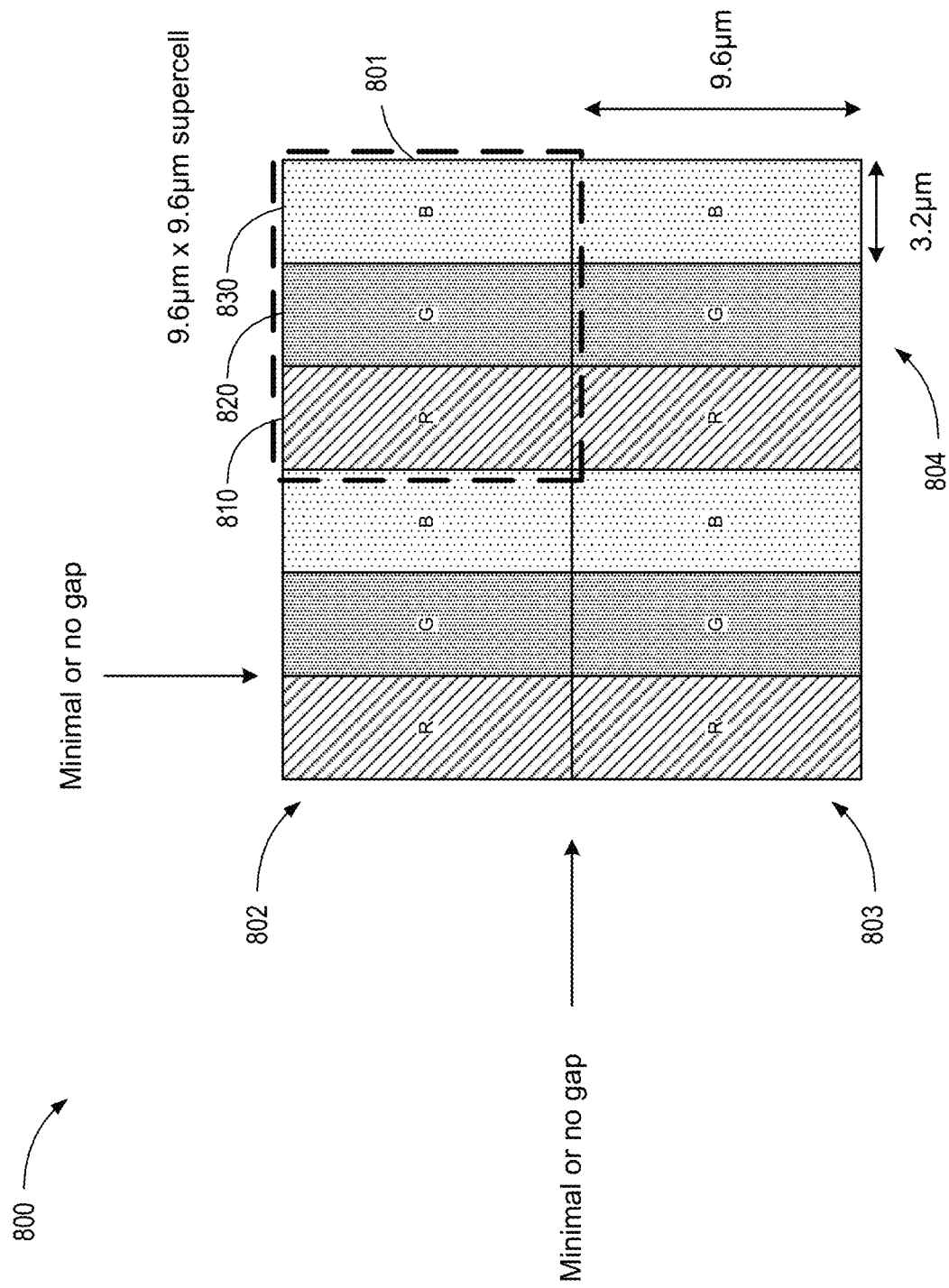
FIG. 8 illustrates an example of a multi-pixel array of RGB cells of metasurfaces, according to one embodiment.

FIG. 8 illustrates an example of a metasurface 800 comprising a multipixel array of four "RGB supercells" 801, 802, 803, and 804, where each of the four RGB supercells 801-804 includes an array of RGB cells 810 (a red cell), 820 (a green cell), and 830 (a blue cell). In the illustrated embodiment, a gap between elements associated with different color subpixels (e.g., the gap between adjacent red and green subpixels) may be nonexistent (gapless), minimized, and/or made to correspond to the spacing of the subpixels in an underlying LED or OLED display.

In the illustrated embodiment, the metasurface 800 includes a two-by-two array of four RGB supercells 801-804, each of which is approximately 9.6 micrometers by 9.6 micrometers, such that the metasurface 800 has a total area of 38.4 square micrometers. Any number of RGB supercells 801-804 may be utilized in square or rectangular arrays to match the dimensions of an underlying LED or OLED display.

The metasurface 800 may be overlaid on and aligned with a corresponding array of LEDs or OLEDs having red, green, and blue subpixels with dimensions and spacings corresponding to the dimensions and spacing of the RGB cells

810-830. In such an embodiment, each individual RGB cell 810-830 operates to deflect optical radiation of a corresponding wavelength (color) from an underlying respective subpixel of the LED or OLED display.

While the presently described systems and methods are generally described in the context of rectangular pixels that each comprise three rectangular subpixels—a red subpixel, a green subpixel, and a blue subpixel—it is appreciated that alternative pixel and/or subpixel shapes are possible, such as squares, hexagons, circles, triangles, ovals, and the like. In such embodiments, each cell of the metasurface may include a selectable number of triangular ridges with varying lengths and/or spacings to allow the dimensions and shape of each cell to approximate the dimensions and shapes of the corresponding subpixels of the LED or OLED display. Similarly, while the presently described systems and methods are generally described in the context of RGB imaging systems and utilize red, green, and blue subpixels for color mixing, it is appreciated that displays may utilize different colors (wavelengths), additional subpixels, and/or different subpixel matrix schemes. For example, an active-matrix OLED or AMOLED display may utilize an RG-BG color scheme that includes a lower percentage of red and blue subpixels relative to the green subpixels. The presently described metasurfaces may be adapted to include a corresponding arrangement of red-green and blue-green cells of triangular ridges.

As another example, an RGBY electronic display may include yellow subpixels in addition to the traditional red, green, and blue subpixels. Again, the presently described metasurface may be adapted such that each supercell includes a red cell, a green cell, a blue cell, and a yellow cell of angled ridges. The dimensions of the angled ridges and interelement spacings may be selected to deflect the yellow optical radiation emitted by the yellow subpixels. For example, for yellow optical radiation having a wavelength between approximately 550 and 590 nanometers, angled ridges may be utilized that have heights between 115 and 160 nanometers, base widths between 375 and 475 nanometers, and inter-ridge gaps between 0 and 35 nanometers to achieve a target deflection angle (e.g., 45 degrees).

Figure 9A:
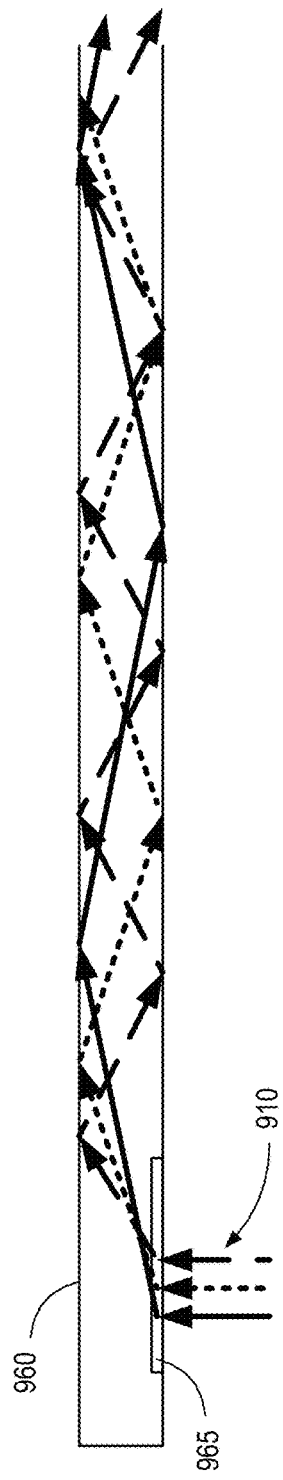
FIG. 9A illustrates a multi-pixel array of RGB cells of metasurfaces used to couple optical radiation into a waveguide, according to one embodiment.

FIG. 9A illustrates a metasurface 965 comprising a multipixel array of RGB cells (e.g., as illustrated and described in conjunction with FIGS. 6A-8) used to couple optical radiation 910 into a waveguide 960, according to one embodiment. As illustrated, the optical radiation 910 includes three different wavelengths (illustrated as different dashed patterns) that are incident on the metasurface 965 substantially perpendicular to the length of the waveguide 960 and normal to the incidence surface of the waveguide. The metasurface 965 may comprise a slanted grating of angled ridges to deflect the incident optical radiation 910 at an angle into the waveguide 960 for total internal reflection (TIR) and conveyance along a length thereof.

Figure 9B:
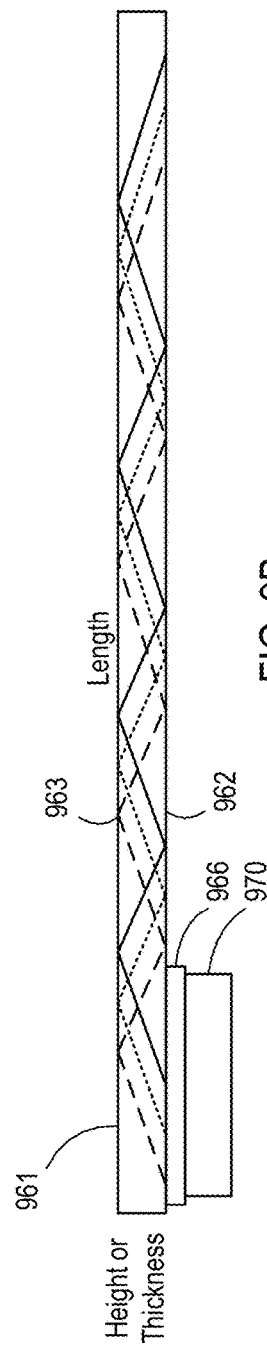
FIG. 9B illustrates a side view of a system with a display to generate optical radiation and a metasurface to couple the optical radiation into a waveguide, according to one embodiment.

FIG. 9B illustrates a side view of an optical system that includes a display 970, a metasurface 966, and a waveguide 961 (e.g., glass or sapphire), according to one embodiment. The display 970 may, for example, comprise a multipixel RGB display configured to generate red, green, and blue optical radiation at an angle perpendicular to the length of the waveguide 961 (e.g., normal or orthogonal to the upper 963 and lower surfaces 962 of the waveguide 961). A metasurface 966 positioned between the display 970 and the waveguide 961 deflects the optical radiation generated by the display 970 into the waveguide 961 at an angle less than a critical angle for total internal reflection.

The metasurface 966 may comprise, as described herein, a slanted grating of elongated angled ridges extending along the width of the waveguide 961 with interelement spacings defined along the length of the waveguide 961. The metasurface 966 couples the optical radiation from the display 970 into the waveguide 961 for transmission along the length thereof. In some embodiments, the display 970 may be in direct contact with the upper edges of the elongated angled ridges of the metasurface 966 or in direct contact with a planar, optically transparent covering on the elongated angled ridges of the metasurface 966. In other embodiments, the display 970 may generate optical radiation that travels through free space (e.g., through a vacuum, air, a gas, or a liquid) for at least a short distance before being received and deflected by the metasurface 966.

Figure 9C:
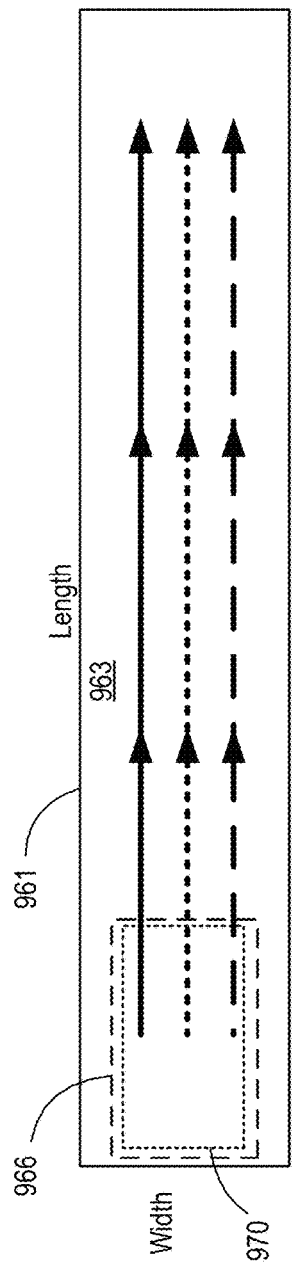
FIG. 9C illustrates a top view of the system of FIG. 9B, according to one embodiment.

FIG. 9C illustrates a top view of the optical system of FIG. 9B, according to one embodiment. As illustrated, optical radiation of varying wavelengths (illustrated as different dashed lines to represent red, green, and blue optical radiation) is transmitted along the length of the waveguide 961. The metasurface 966 and the underlying display 970 are visible in broken lines through the upper surface 963 of the waveguide 961. The elongated angled ridges of the slanted grating metasurface extend along the width of the metasurface and are spaced along the length thereof. In the illustrated example, the elongated angled ridges of the slanted grating metasurface extend along the width of the metasurface but do not extend to the edges thereof. In other embodiments, the elongated angled ridges of the slanted grating metasurface may extend across the width of the waveguide from edge to edge.

Figure 10A:
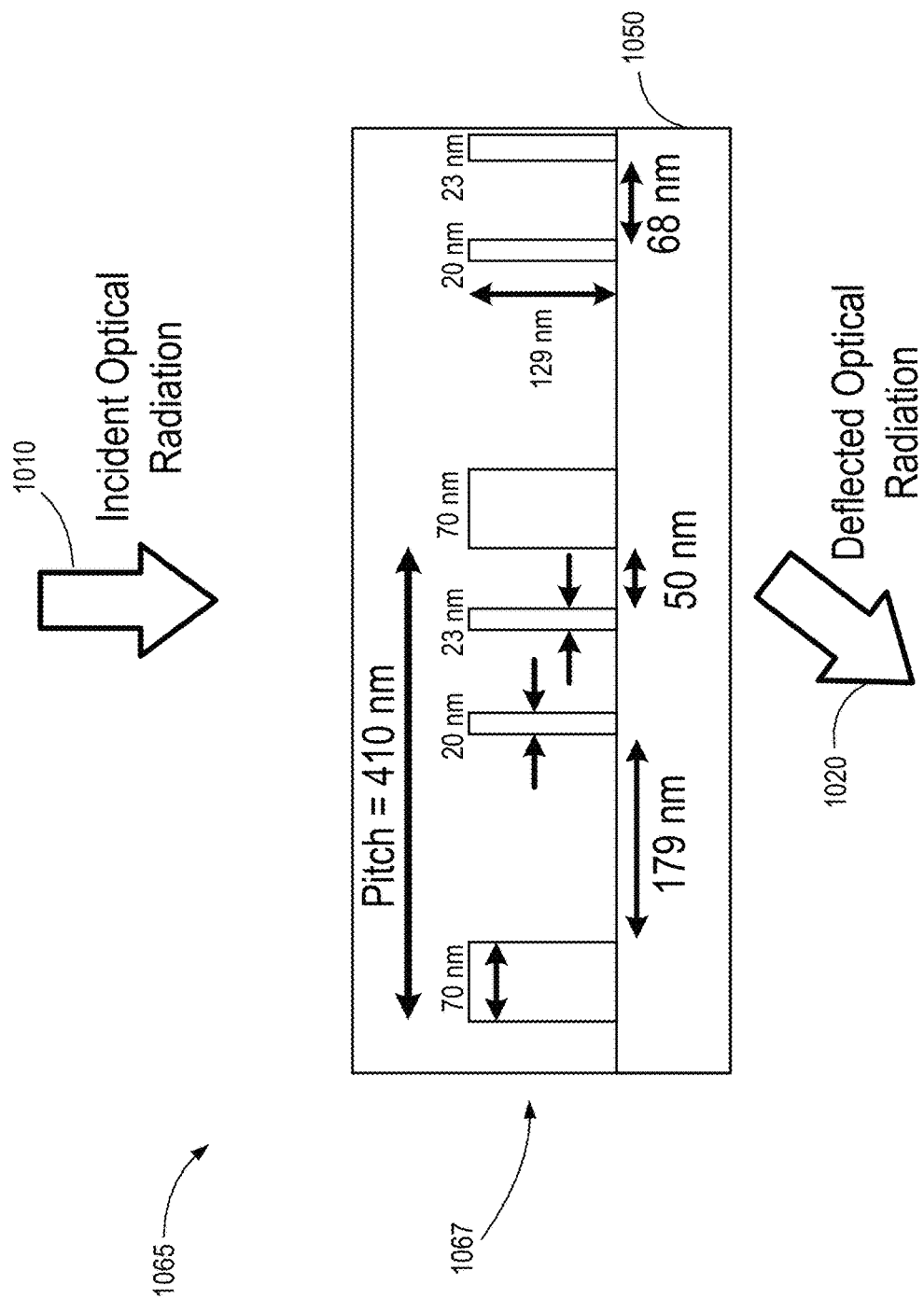
FIG. 10A illustrates an example of a metasurface with rectangular ridges to couple optical radiation into a waveguide, according to one embodiment.

FIG. 10A illustrates a cross-section view of an alternative embodiment of a portion of a metasurface 1065 with rectangular ridges 1067 (e.g., that extend into and out of the page) to deflect incident optical radiation 1010 as deflected optical radiation 1020 into a waveguide, according to one embodiment. The metasurface 1065 includes a plurality of rectangular ridges 1067 having varying widths and interelement spacings that extend from a substrate 1050. In the illustrated embodiment, a pattern of three rectangular ridges 1067 having widths of 70 nanometers, 20 nanometers, and 23 nanometers is repeated every 410 nanometers (the pitch of the repeating pattern).

Spacings between the rectangular ridges 1067 in the repeating pattern are illustrated as example values of 179 nanometers, 68 nanometers, and 50 nanometers, respectively. In some embodiments, the rectangular ridges 1067 are formed from polysilicon. The specific heights, widths, and interelement spacings of the rectangular ridges 1067 and the number of rectangular ridges 1067 may be adjusted to efficiently couple one or more specific wavelengths of optical radiation into a waveguide.

Figure 10B:
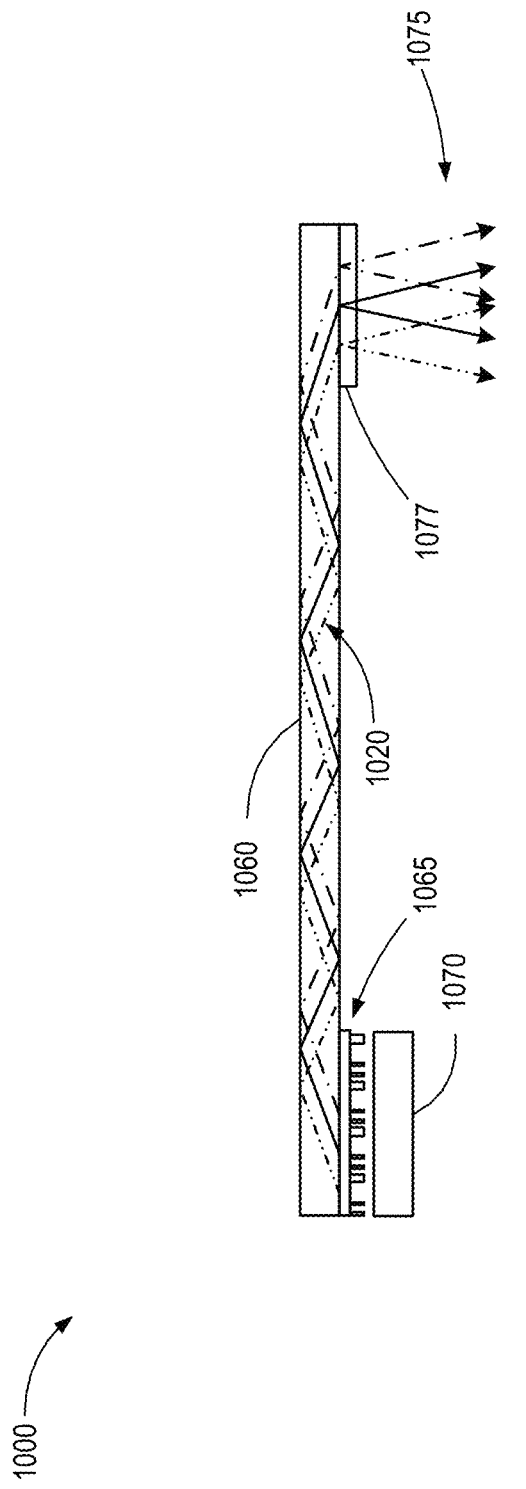
FIG. 10B illustrates a metasurface with rectangular ridges coupling optical radiation from a display engine into a waveguide, according to one embodiment.

FIG. 10B illustrates an optical system 1000 comprising the metasurface 1065 of FIG. 10A with rectangular ridges coupling optical radiation from a display engine 1070 into a waveguide 1060, according to one embodiment. The optical system 1000 includes an output metasurface coupler 1077 as well. The display engine 1070 generates optical radiation as, for example, part of an RGB display of LEDs. The metasurface 1065 deflects the RGB optical radiation generated by the display engine 1070 into the waveguide 1060 at an angle less than a critical angle for total internal reflection within the waveguide 1060, at 1020. The optical radiation is conveyed, at 1020, to the other end of the waveguide 1060 where it is decoupled from the waveguide 1060 by the output metasurface coupler 1077 or another device (e.g., a surface relief grating) for free-space transmission, projection, or display, at 1075 (e.g., for visualization by a user through via frequency-selective focusing to a target plane).

Figure 11A:
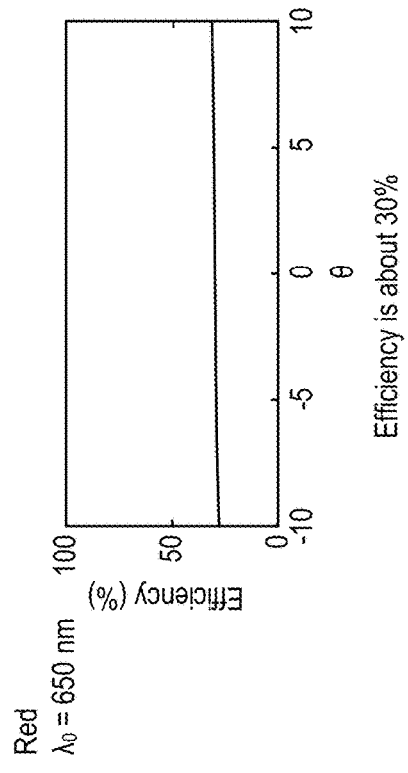
FIGS. 11A-C illustrate simulated graphs of diffraction efficiencies of metasurfaces of rectangular ridges for red, green, and blue optical radiation, according to various embodiments.

FIG. 11A illustrates a graph of the diffraction efficiency of a metasurface of rectangular ridges with respect to the angle of incidence of blue optical radiation (e.g., with a wavelength of approximately 490 nanometers). As illustrated, the diffraction efficiency of the metasurface of rectangular ridges is relatively low (approximately 30%) for this blue optical radiation.

Figure 11B:
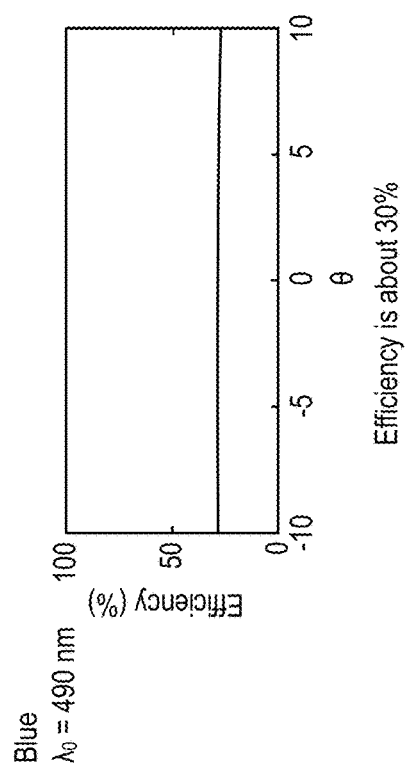

FIG. 11B illustrates a graph of the diffraction efficiency of a metasurface of rectangular ridges with respect to the angle of incidence of red optical radiation (e.g., with a wavelength of approximately 650 nanometers). Again, the diffraction efficiency of the metasurface of rectangular ridges is relatively low (approximately 30%) for red optical radiation.

Figure 11C:
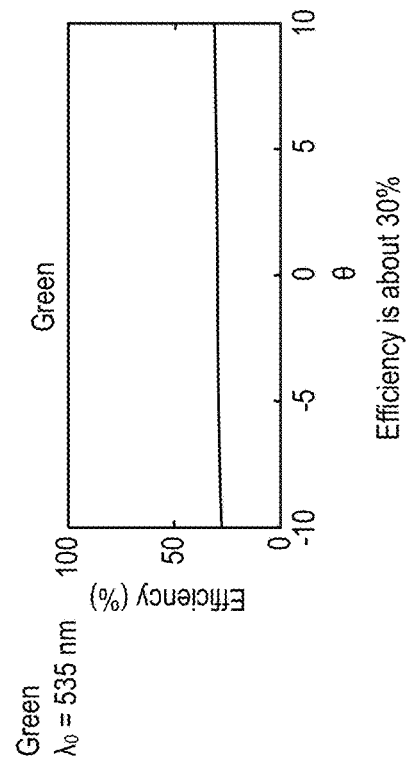

FIG. 11C illustrates a graph of the diffraction efficiency of a metasurface of rectangular ridges with respect to the angle of incidence of green optical radiation (e.g., with a wavelength of approximately 535 nanometers). Again, the diffraction efficiency of the metasurface of rectangular ridges is relatively low (approximately 30%) for green optical radiation.

Figure 12:
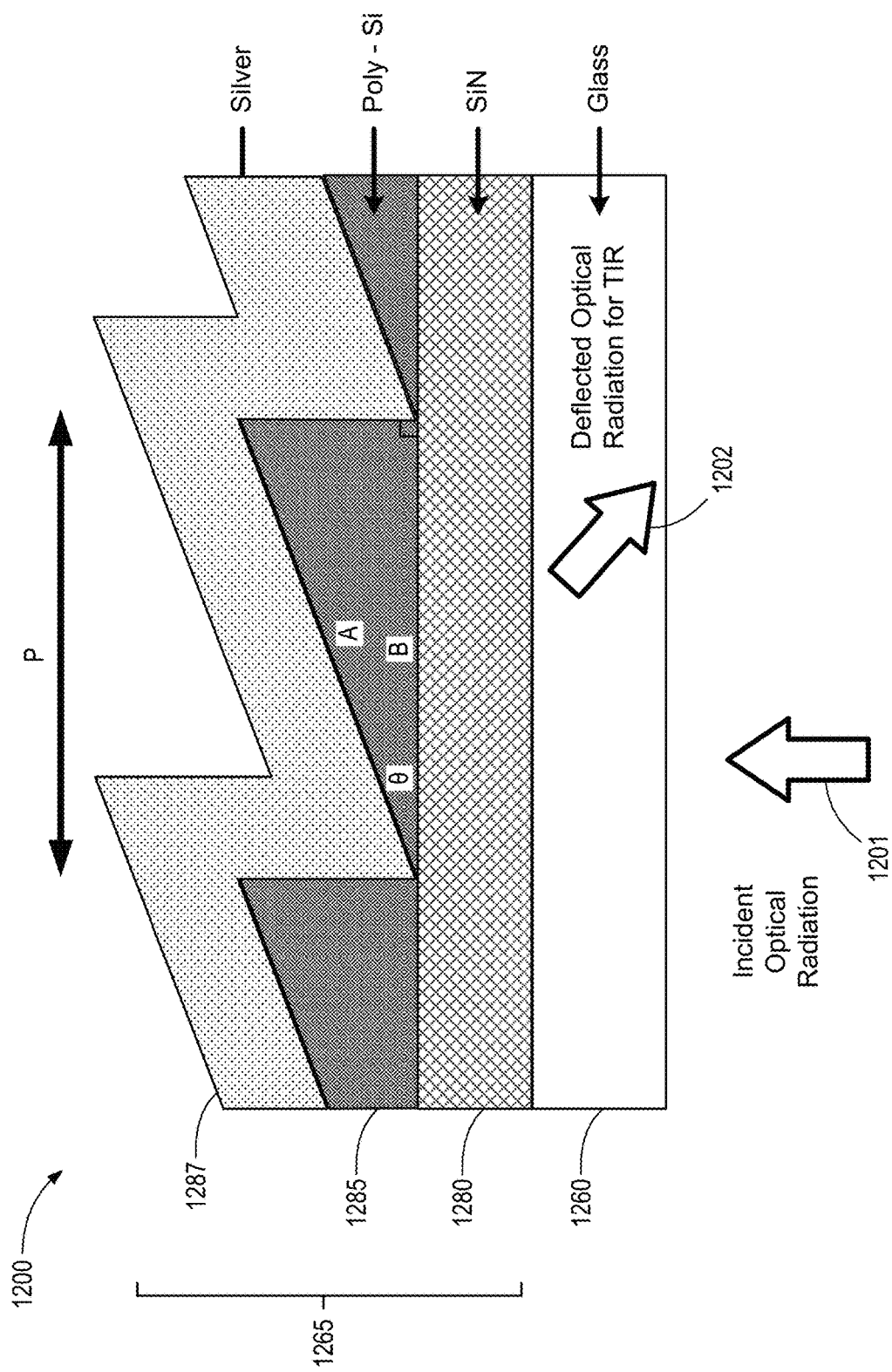
FIG. 12 illustrates an example of a metasurface coupler comprising a slanted grating of angled ridges to couple optical radiation into a waveguide, according to one embodiment.

FIG. 12 illustrates an optical system 1200 that utilizes a metasurface coupler 1265 to couple incident optical radiation 1201 into a waveguide 1260, according to one embodiment. The metasurface coupler 1265 operates to reflectively couple incident optical radiation 1201 into the waveguide 1260 after the incident optical radiation 1201 passes through the waveguide 1260. As with the other figures described herein, FIG. 12 is not drawn to scale.

The metasurface coupler 1265 comprises a plurality of elongated angled ridges 1285 formed on top of a substrate 1280 on the waveguide 1260. The cross-sectional view of FIG. 12 shows the elongated angled ridges 1285 as triangles with the understanding that the shape extends in and out of the page, such that each of the elongated angled ridges 1285 approximates the shape of an elongated right triangular polyhedron. An optically reflective layer 1287 is deposited on the triangular ridges 1285 to reflect incident optical radiation with high efficiency. The optically reflective layer 1287 is illustrated as a conformally deposited layer of silver; however, any of a wide variety of reflective metals or metal alloys may be utilized and/or the layer may or may not be conformal. Examples of suitable reflective materials include silver, gold, aluminum, other noble metals, and/or combinations thereof.

According to various embodiments, the waveguide 1260 may comprise glass, sapphire, fused silica, or the like. The substrate 1280 of the metasurface coupler 1265 may comprise a material having a relatively high refractive index. In some embodiments, the substrate 1280 is deposited on the waveguide 1260 during the fabrication of the metasurface coupler 1265 (e.g., as the first layer). In other embodiments, the metasurface coupler 1265 may be fabricated on the substrate 1280, and, once fabrication is complete, the substrate may be fused or otherwise bonded to the waveguide 1260.

The incident optical radiation 1201 is incident on a lower surface of the waveguide 1260 and passes through the waveguide 1260 and the substrate 1280 and the polysilicon, elongated angled ridges 1285, which are coated with a reflective silver layer 1287. The reflective silver layer 1287 reflects the optical radiation back through the polysilicon, elongated angled ridges 1285 and the substrate 1280 into the waveguide 1260, at 1202, at an angle less than a critical angle for total internal reflection therein and conveyance along the length thereof.

The elongated angled ridges 1285 for a slanted grating may extend for microns, millimeters, or centimeters along the width of the waveguide 1260 (e.g., in and out of the page). In the illustrated embodiment, the base face (labeled B) of each elongated angled ridge may have a width of approximately 400 nanometers. As there are no gaps between adjacent elongated angled ridges in the illustrated embodiment, the pitch (labeled P) of the elongated angled ridges 1285 in the metasurface coupler 1265 is also 400 nanometers.

Each elongated angled ridge 1285 has a height face (labeled H) that extends from the base face (B) to a height of approximately 145 nanometers. As the height face (H) and the base face (B) are perpendicular to one another, the elongated angled ridges 1285 approximate the shape of a right-angle triangular polyhedron in which the hypotenuse or angled face (A) extends from one edge of the base face (B) to an edge of the height face (H) with an internal angle ($\theta$) of approximately 19.2 degrees.

The specific dimensions of the elongated angled ridges 1285 may be modified or adjusted to increase the efficiency and/or operability of the metasurface coupler 1265 to deflect specific wavelengths of optical radiation into the glass waveguide 1260 for total internal reflection. In some embodiments, the elongated angled ridges 1285 may be formed on a thin, planar layer of polysilicon deposited on the substrate 1280. The thin planar layer of polysilicon may, for example, have a thickness of fewer than 30 nanometers. In some embodiments, the elongated angled ridges 1285 may be formed directly on the substrate 1280, such that there is no additional planar layer of polysilicon deposited between the elongated angled ridges 1285 and the substrate 1280.

According to various embodiments, the same metasurface coupler 1265 with elongated angled ridges 1285 having the same dimensions may be used for red, green, and blue optical radiation. In other embodiments, for red optical radiation, the hypotenuse face of each elongated angled ridge 1285 relative to the base face may be approximately 16 degrees. For green optical radiation, the hypotenuse face of each elongated angled ridge 1285 relative to the base face may be approximately 20 degrees. For blue optical radiation, the hypotenuse face of each elongated angled ridge 1285 relative to the base face may be approximately 22.5 degrees.

Figure 13A:
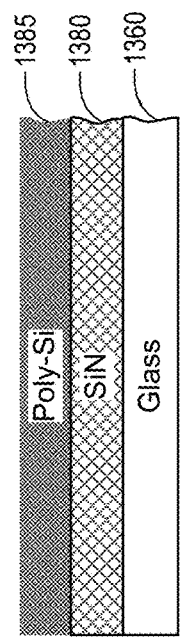
FIGS. 13A-D illustrate an example diagram of a manufacturing process for a metasurface coupler, according to one embodiment.

FIGS. 13A-D illustrate an example diagram of a manufacturing process for a slanted grating metasurface coupler, according to one embodiment. FIG. 13A illustrates a waveguide 1360 that may be any length, width, and thickness suitable for conveying optical radiation from one end to another end. The waveguide 1360 may be, for example, a glass waveguide as illustrated, or manufactured using one or more alternative materials, such as sapphire, fused silica, high-index glass, or other suitable waveguide material.

Figure 13B:
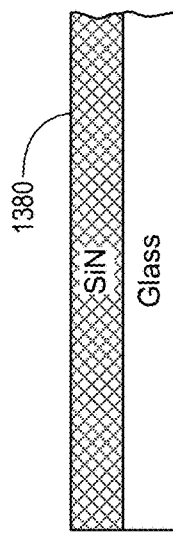

As illustrated in FIG. 13B, an optically transparent layer 1380, such as the illustrated silicon nitride optically transparent layer, is deposited on the waveguide 1360. The optically transparent layer 1380 may comprise a single layer or multiple layers and may include one or more of silicon nitride, amorphous silicon, lithium niobate (LiNBO3) and/or another optically transparent material.

Figure 13C:
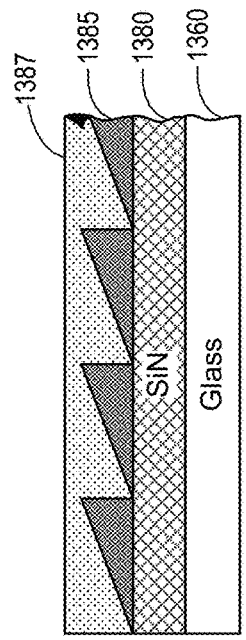
Figure 13D:
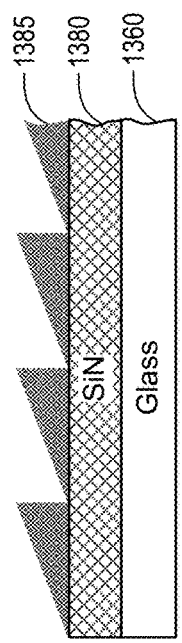

In FIG. 13C, a polysilicon (Poly-Si) layer 1385 is deposited on the silicon nitride optically transparent layer 1380. In FIG. 13D, the polysilicon layer 1385 is etched (e.g., via reactive-ion etching, ion milling via a focused ion beam, nanoimprinting, or the like) to form a one-dimensional array of parallel, elongated angled ridges (extending into and out of the page in the illustrated example). In the illustrated example, the elongated angled ridges 1385 have uniform heights and widths and are gapless, such that there is no spacing between adjacent elongated angled ridges 1385. In some embodiments, the elongated angled ridges 1385 and/or the silicon nitride optically transparent layer 1380 may be annealed to improve optical transmittance efficiencies and/or modify other optical characteristics thereof.

Figure 13E:
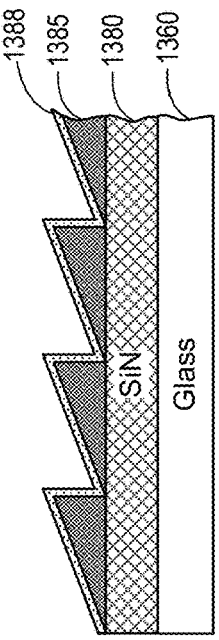
FIG. 13E illustrates a reflective layer deposited on the angled ridges of the slanted grating metasurface, according to one embodiment.
Figure 13F:
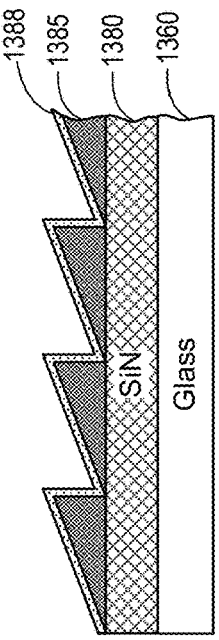
FIG. 13F illustrates an alternative embodiment with a reflective coating on angled ridges of the slanted grating metasurface, according to one embodiment.

In FIG. 13E, a reflective layer 1387 (e.g., silver, gold, aluminum, another noble metal, or another suitably reflective ground plane material) is deposited on top of the elongated angled ridges 1385. Alternatively, in FIG. 13F, a reflective coating 1388 may be thinly applied to the elongated angled ridges 1385 sufficient to reflect optical radiation back through the silicon nitride optically transparent layer 1380 and into the waveguide 1360. For example, a 100-nanometer layer of silver may be applied to the exposed surface of the elongated angled ridges 1385 for total or near-total reflection.

Figure 14:
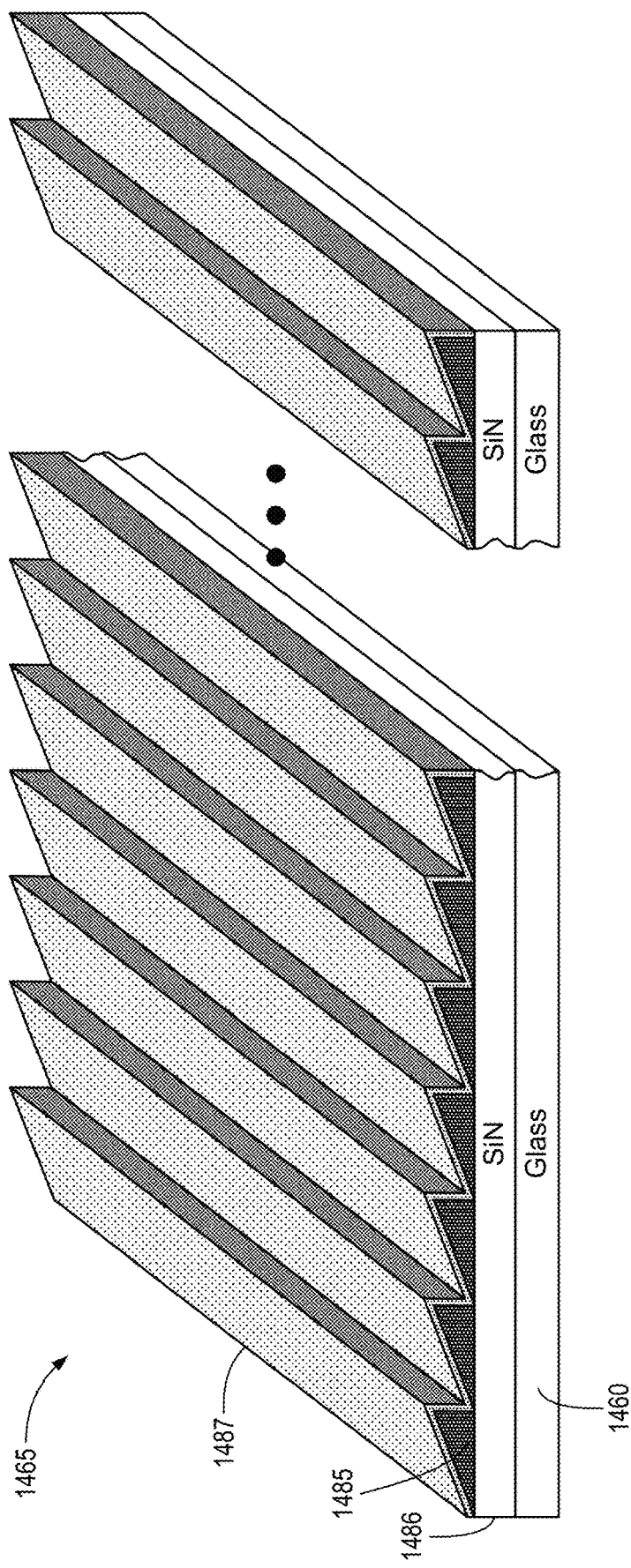
FIG. 14 illustrates a perspective view of a portion of a metasurface coupler, according to one embodiment.

FIG. 14 illustrates a perspective view of a portion of a slanted grating metasurface coupler 1465 that includes a one-dimensional array of angled ridges 1485 having subwavelength dimensions, according to various embodiments. As illustrated, the one-dimensional array of angle ridges 1485 is formed on a substrate 1486 (such as silicon nitride), which is deposited directly on a glass waveguide 1460. The angled ridges 1485 are illustrated with a relatively thin coating of a reflective metal layer 1487, such as silver, gold, aluminum, or another noble metal.

Figure 15:
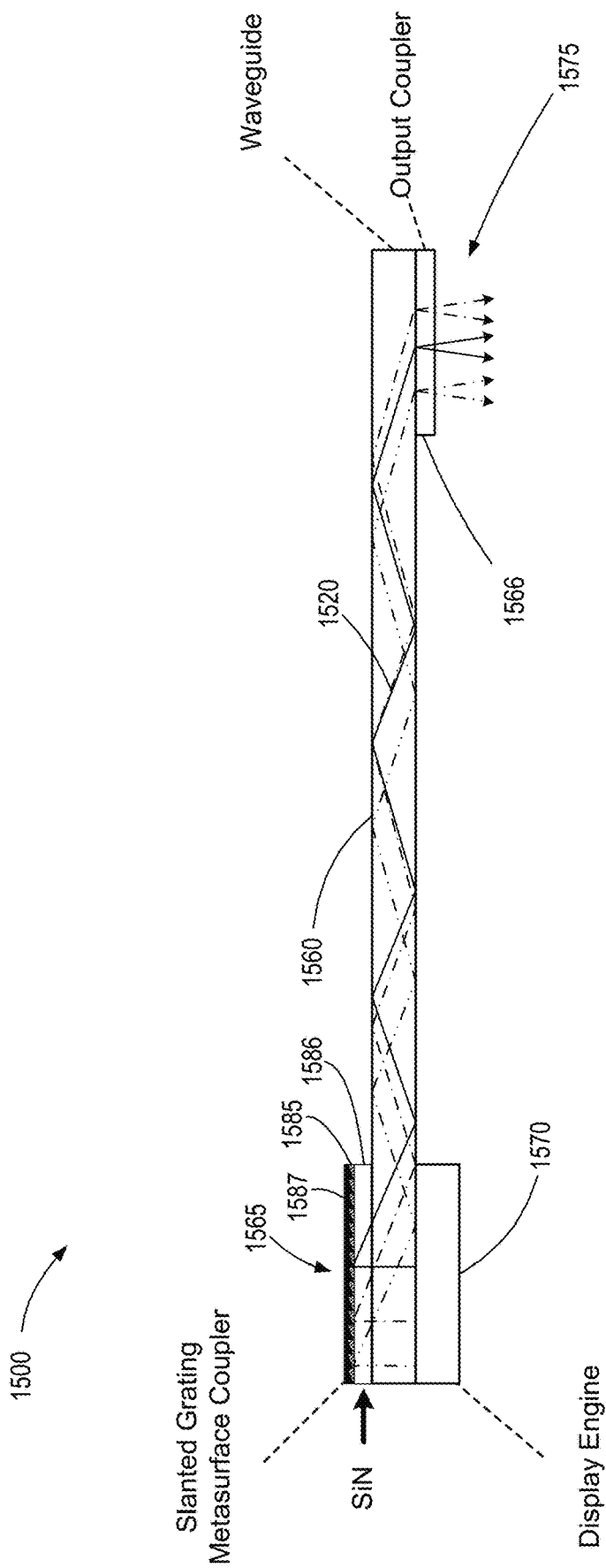
FIG. 15 illustrates an optical system with a metasurface coupler to couple optical radiation into a waveguide, according to one embodiment.

FIG. 15 illustrates an optical system 1500 with a slanted grating metasurface coupler 1565 to couple optical radiation into a waveguide 1560, according to one embodiment. As illustrated, a display engine 1570 transmits optical radiation (e.g., red, green, and blue optical radiation) through the waveguide 1560. The optical radiation travels through the waveguide 1560 and a substrate 1586 of the slanted grating metasurface coupler 1565. The optical radiation is deflected by the subwavelength elongated angled ridges 1585 coated with a reflective metallic layer 1587.

The optical radiation is reflected by the reflective metallic layer 1587 (e.g., silver, gold, aluminum, or a combination thereof) on the subwavelength angled ridges 1585 of the slanted grating metasurface coupler 1565. The optical radiation is deflected by the subwavelength angled ridges 1585 of the slanted grating metasurface coupler 1565 before it passes back through the substrate 1586 and into the waveguide 1560 at an angle for total internal reflection and transmission, at 1520, along the length of the waveguide 1560 to an output coupler 1566. The optical radiation may then be directed into another optical device and/or emitted as free-space optical radiation 1575.

Figure 16A:
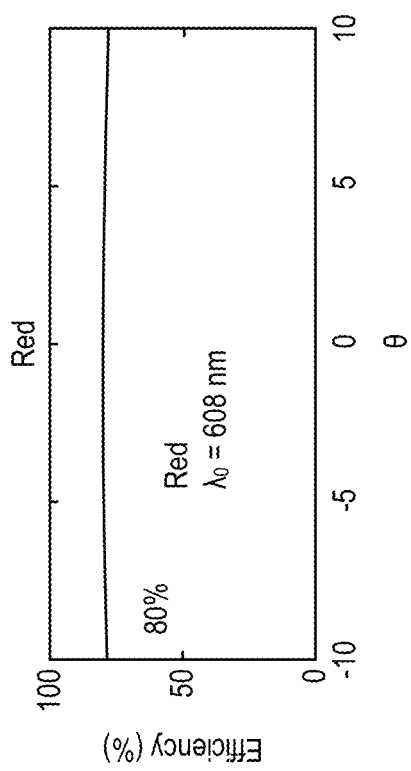
FIGS. 16A-C illustrate simulated graphs of the waveguide coupling efficiencies of slanted grating metasurface for red, green, and blue optical radiation, according to various embodiments.

FIG. 16A illustrates a simulated graph of the efficiency with which a slanted grating metasurface coupler of elongated angled ridges couples 608-nanometer optical radiation into a waveguide for total internal reflection therein, according to one embodiment. As illustrated, the simulated coupler efficiency for this wavelength of red light is approximately 80% in all simulated conditions.

Figure 16C:
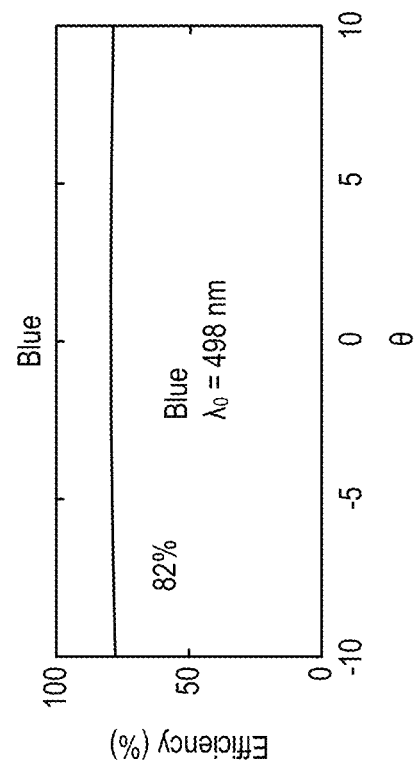
Figure 16B:
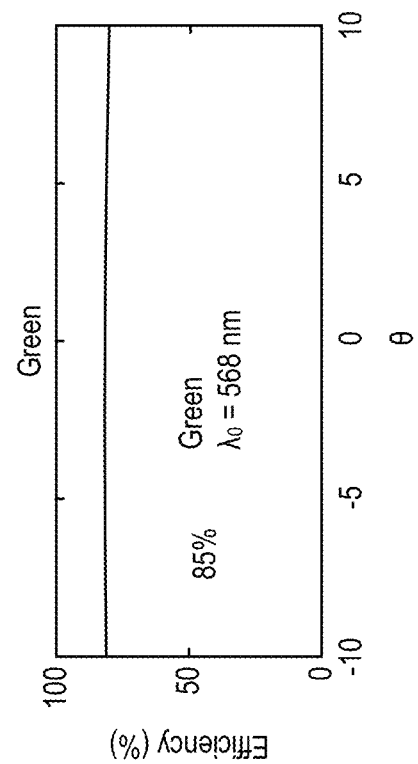

FIG. 16B illustrates a simulated graph of the efficiency with which a grating metasurface coupler of elongated angled ridges couples 568-nanometer optical radiation into a waveguide for total internal reflection therein, according to one embodiment. As illustrated, the simulated coupler efficiency for this wavelength of green light is approximately 85% in all simulated conditions.

FIG. 16C illustrates a simulated graph of the efficiency with which a slanted grating metasurface coupler of elongated angled ridges couples 498-nanometer optical radiation into a waveguide for total internal reflection therein, according to one embodiment. As illustrated, the simulated coupler efficiency for this wavelength of blue light is approximately 82% in all simulated conditions.

Figure 17:
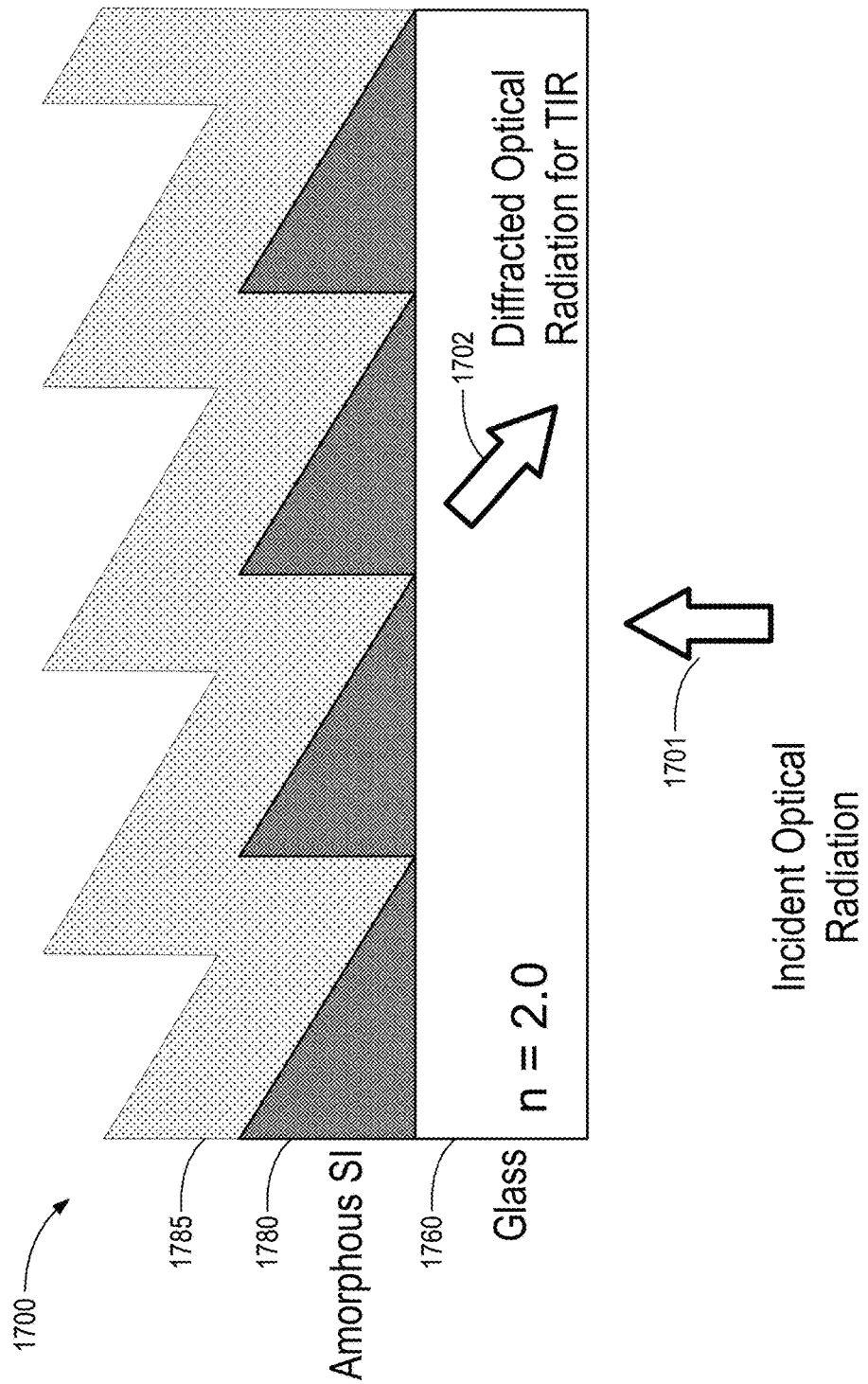
FIG. 17 illustrates a slanted grating metasurface with elongated angled ridges of amorphous silicon formed directly on a high-index glass waveguide, according to one embodiment.

FIG. 17 illustrates an optical system 1700 in which a slanted grating metasurface coupler operates to couple incident optical radiation 1701 into a high-index glass waveguide substrate 1760 for total internal reflection therein, at 1702. The metasurface coupler includes a one-dimensional array of elongated angled ridges 1780 of amorphous silicon formed directly on the high-index glass waveguide substrate 1760. An optically reflective metallic layer 1785 is deposited as a layer or coating on the right-elongated angled ridges 1780.

In various embodiments, amorphous silicon or another material or combination of materials, such as silicon nitride, titanium dioxide, lithium niobate, polysilicon, or the like is deposited directly on the high-index glass waveguide substrate 1760. In one example, the layer of amorphous silicon is initially formed with a thickness of approximately 145 nanometers. The amorphous silicon is etched to form the elongated angled ridges 1780, after which the metallic layer 1785 or similar coating is deposited on the elongated angled ridges 1780 with a thickness of approximately 100 nanometers.

According to various embodiments, an angled face (or a hypotenuse face in the case of right-angle triangle cross-sections, as illustrated) of the elongated angled ridges 1780 relative to a base face may be approximately 16 degrees for red wavelengths of optical radiation, approximately 20 degrees for green wavelengths of optical radiation, and approximately 22.5 degrees for blue wavelengths of optical radiation.

In some embodiments, a slanted grating metasurface coupler with an array of elongated angled ridges having uniform dimensions and angles between the base, height, and hypotenuse faces (or angled faces in the case of elongated angled ridges having non-right-angle triangular cross-sections) may be used for multiple wavelengths of optical radiation. For instance, a common slanted grating metasurface coupler of elongated angled ridges may be used to couple red, green, and blue optical radiation into a waveguide for total internal reflection therein. Devices that utilize different angles of ridges for each color are aligned with the corresponding color of an underlying subpixel. However, a common metasurface coupler that uses the same elongated angled ridges for each color does not require subpixel alignment.

Figure 18:
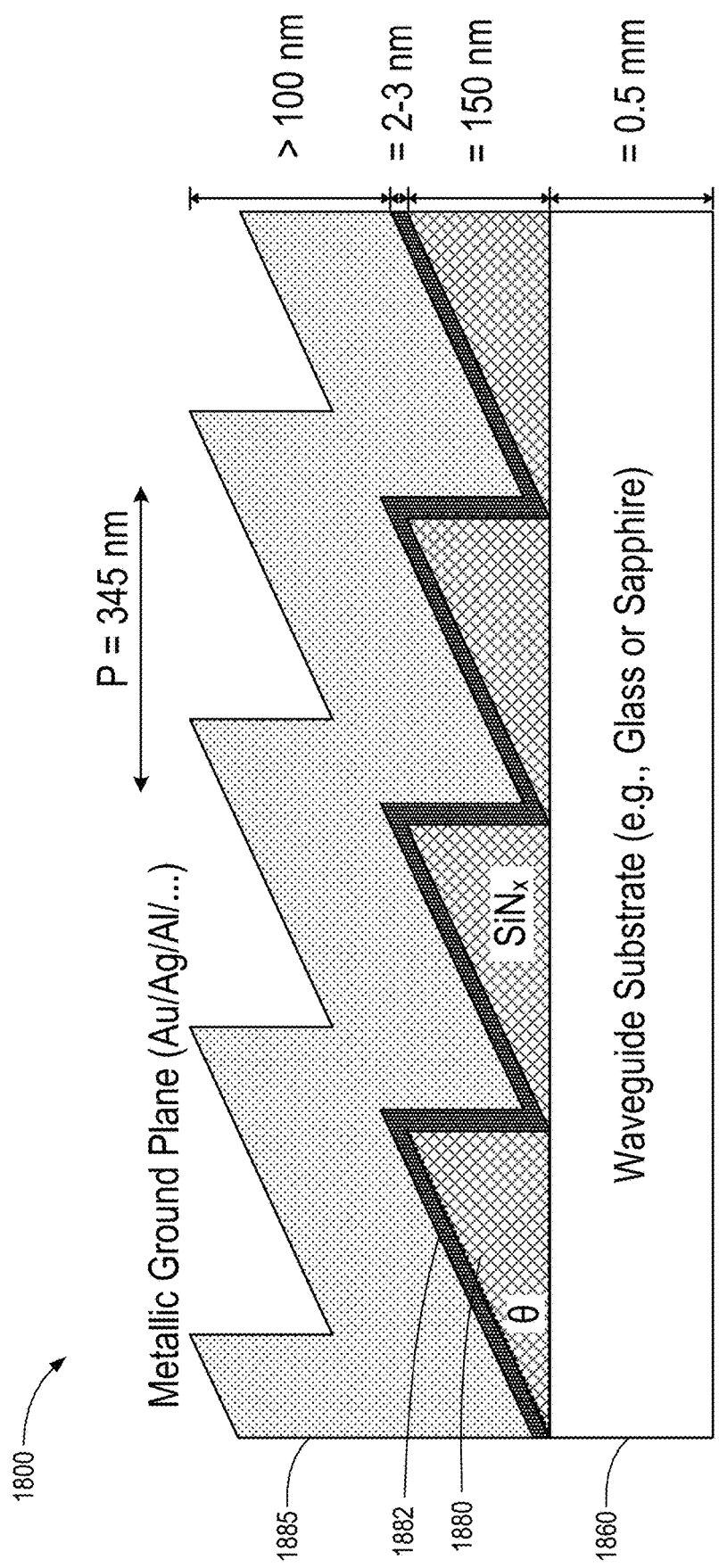
FIG. 18 illustrates an example of an optical system with a slanted grating metasurface coupler with elongated angled ridges of silicon nitride directly on a glass or sapphire waveguide, according to various embodiments.

FIG. 18 illustrates an example of an optical system 1800 with a metasurface coupler with a slanted grating formed as an array of elongated angled ridges 1880, whose cross-section is a triangle. The elongated angled ridges 1880 of silicon nitride are formed directly on a glass or sapphire waveguide substrate 1860, according to various embodiments. The illustrated embodiment includes a waveguide substrate with a thickness of approximately 0.5 millimeters. The elongated angled ridges 1880 extend along a width of the waveguide substrate 1860 (i.e., in and out of the page).

Each elongated angled ridge 1880 includes a base face that is co-planar with the surface of the waveguide 1860, a height face that extends from the base face to a ridge height with an internal angle greater than 60 degrees relative to the base face (illustrated as a perpendicular 90 degrees), and an angled face that extends between an edge of the base face and the edge of the height face at a target internal angle less than 25 degrees relative to the base face. In the illustrated embodiment, the base face has a width of 345 nanometers and the height face extends to a ridge height of 150 nanometers. The internal angle between the angled face and the base face is approximately 23.45 degrees. As there is no gap or spacing between adjacent elongated angled ridges 1880 in the illustrated embodiment, the pitch of the array of elongated angled ridges 1880 forming the slanted grating is equal to the width of the base face of an individual elongated angled ridges 1880, which is 345 nanometers in the illustrated embodiment.

The slanted grating of the metasurface coupler includes a reflective metallic ground plane 1885 (e.g., a layer or coating), which is adhered to the array of elongated angled ridges 1880 via a thin metallic adhesion layer 1882. According to various embodiments, the metallic adhesion layer 1882 may be a layer of titanium (Ti) or Chromium (Cr) that is 1-5 nanometers thick (illustrated as 2-3 nanometers). The reflective metallic ground plane 1885 may have a thickness of approximately 100 nanometers or more and comprise one or more of gold, silver, aluminum, another noble metal, and/or alloys or multilayers thereof.

FIGS. 19A-J illustrate a diagram of a manufacturing process for a metasurface coupler, according to one embodiment.

FIG. 19A illustrates a silicon nitride layer 1980 deposited on a planar face of a waveguide substrate 1960. A thin conductive layer 1981 is deposited on the silicon nitride layer 1980 to facilitate electron beam lithography of a subsequently deposited photoresist.

FIG. 19B illustrates a photoresist 1983 applied as a coating on the thin conductive layer 1981. The photoresist 1983 is processed to define a plurality of elongated rectangular cuboids of photoresist that extend orthogonally with respect to the planar face of the waveguide substrate 1960 (i.e., in an out of the page). For example, electron beam lithography may be used to define the plurality of elongated rectangular cuboids of photoresist to each have a width between 70 and 130 nanometers and an interelement spacing between 300 and 400 nanometers.

FIG. 19C illustrates elongated rectangular cuboids of photoresist 1984 extending orthogonally with respect to the planar face of the waveguide substrate 1960, according to one embodiment.

Figure 19D:
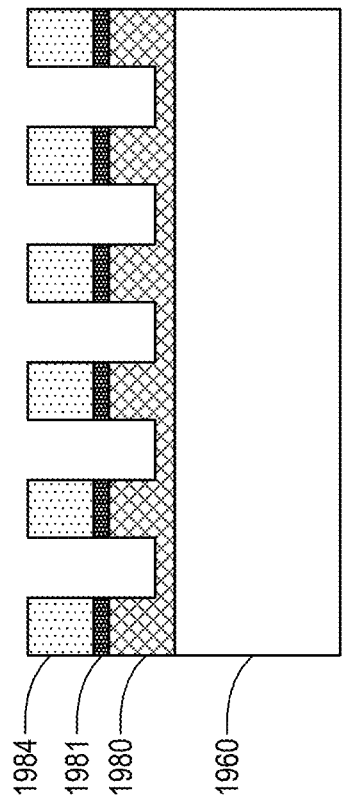

FIG. 19D illustrates the very thin conductive layer 1981 (e.g., Pd/Au) etched or otherwise removed from channels between the elongated rectangular cuboids of photoresist 1984, according to one embodiment. With the conductive layer 1981 removed from the channels between the elongated rectangular cuboids of photoresist 1984, the silicon nitride 1980 can be etched within the channels to a target depth.

Figure 19E:
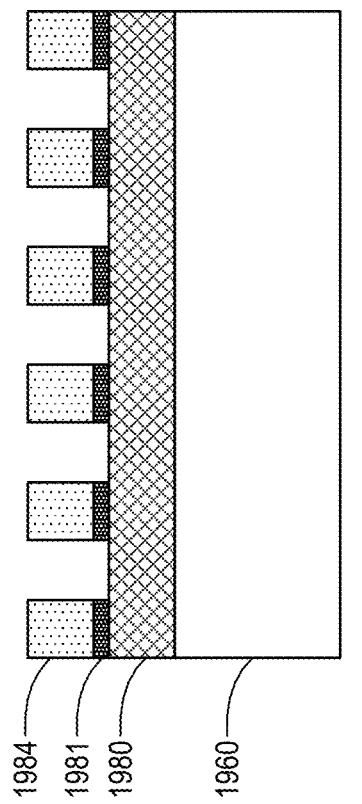

FIG. 19E illustrates the partial etching (e.g., using reactive-ion etching (RIE)) of the silicon nitride layer 1980 between the rectangular cuboids of photoresist 1984 to a target depth. As illustrated, a thin layer of silicon nitride 1980 remains in the channels between the rectangular cuboids of photoresist 1984. With the partial etching of the silicon nitride layer 1980 completed, the rectangular cuboids of photoresist 1984 can be removed from the silicon nitride layer 1980.

Figure 19F:
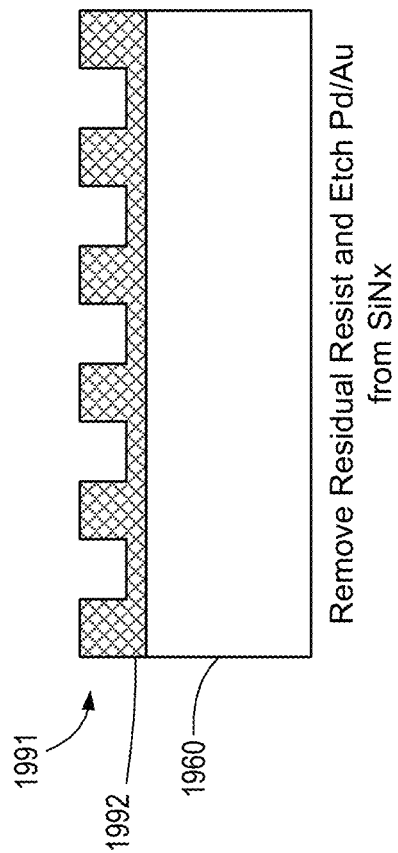

FIG. 19F illustrates an exposed plurality of elongated rectangular ridges of silicon nitride 1991 extending from a base layer of silicon nitride 1992 having an initial thickness. The elongated rectangular ridges of silicon nitride 1991 extend into and out of the page (e.g., along the width of the planar waveguide).

Figure 19G:
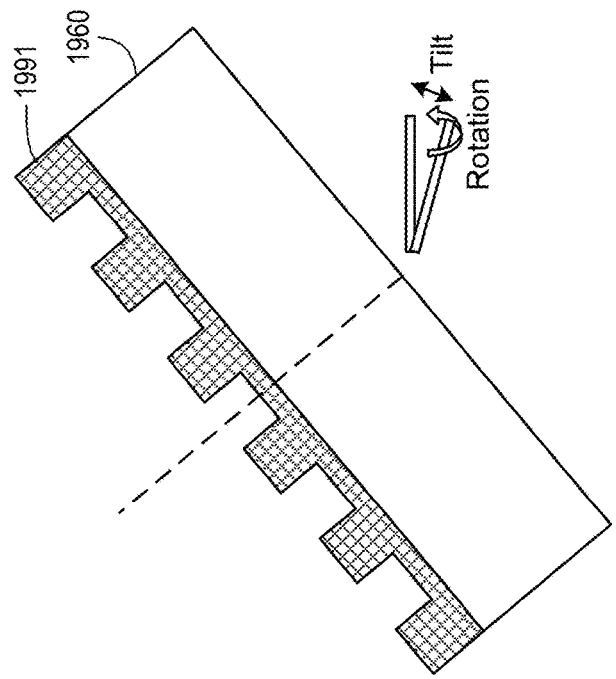

FIG. 19G illustrates ion beam milling of the silicon nitride layer 1980 via an ion beam milling system 1911. The silicon nitride layer 1980 is milled via the ion beam 1912 at an angle with respect to the normal (dashed line) of the planar face of the waveguide substrate 1960. The ion beam milling process operates to shape the silicon nitride layer 1980 into elongated angled ridges by an additive process that "pushes" the silicon nitride from the field onto the wall of the rectangular ridge that was previously formed through the vertical etching process (e.g., the reactive-ion etching process above). The thickness of the remaining base layer of silicon nitride after milling, if any, is selected based on the milling rate of the silicon nitride and the beam angle utilized.

Figure 19H:
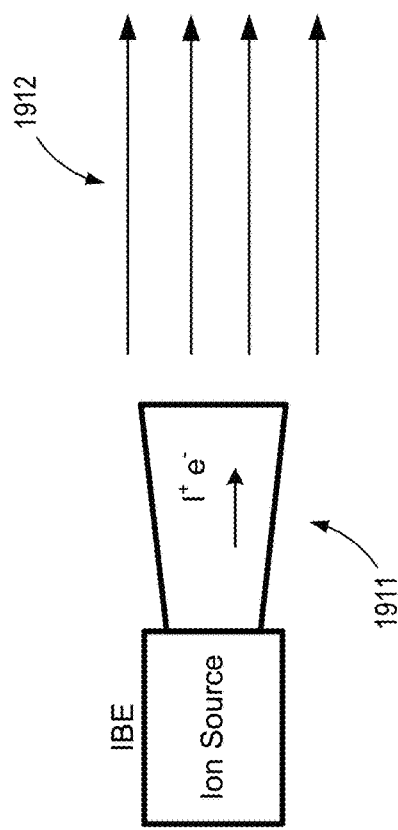

FIG. 19H illustrates the triangular cross-section of the ion beam-etched elongated angled ridges 1993 of silicon nitride on the surface of the waveguide substrate 1960. As described herein, the elongated angled ridges 1993 are formed through a two-stage etching process. The first stage includes vertical etching (e.g., reactive-ion etching) to form the rectangular ridges (FIG. 19F) that serve as backstops during the second stage. The second stage is the ion beam etching or milling to push the silicon nitride from the base layer onto the wall of the rectangular ridges to form slanted grating of elongated angled ridges 1993, as illustrated in FIG. 19H.

FIG. 19I illustrates a thin adhesion layer 1982, such as titanium or chromium, applied to the elongated angled ridges 1993 of silicon nitride. The thin adhesion layer 1982 is, in some embodiments, a first sublayer of a metallic layer to be deposited over the elongated angled ridges 1993 of silicon nitride.

FIG. 19J illustrates an optically reflective metallic layer 1985 deposited over the thin adhesion layer 1982. The optically reflective metallic layer 1985 is, in some embodiments, a second sublayer of the metallic layer deposited over the elongated angled ridges 1993 of silicon nitride.

FIGS. 20A-C illustrate a diagram of an additive ion beam etching process to form elongated angled ridges of silicon nitride on a waveguide, according to various embodiments.

FIG. 20A illustrates an ion beam 2012 etching a silicon nitride layer 2080 to form a slanted grating of elongated angled ridges of silicon nitride on the waveguide substrate 2060. As described herein, the ion beam 2012 operating at an angle relative to nanometer-scale ridges and channels of silicon nitride 2080 functions as an additive process.

FIG. 20B illustrates the additive process accomplished by the ion beam etching process that operates to create the slanted grating of elongated angled ridges of silicon nitride on the waveguide substrate 2060. As illustrated, the ion beam 2012 operates to remove silicon nitride from the region 2078 in each channel and deposit at least some of the silicon nitride in the region 2079. The movement of silicon nitride from the region 2078 to the region 2079 via the additive ion beam etching process, and similar movements of silicon nitride from corresponding regions relative to each respective rectangular ridge of silicon nitride, results in the formation of a one-dimensional array of elongated angled ridges of silicon nitride.

FIG. 20C illustrates elongated angled ridges 2099 of silicon nitride extending from a thinned base layer 2092 of silicon nitride on the waveguide substrate 2060. As described herein, the base layer 2092 of silicon nitride may be less than 30 nanometers thick, while the elongated angled ridges 2099 may extend to a height between 70 and 200 nanometers. In some embodiments, the base layer 2092 may be omitted (i.e., have a thickness of 0 nanometers). The specific dimensions of the elongated angled ridges 2099, as described according to any of the various embodiments described herein, may be formed using the fabrication processes and techniques described in conjunction with FIGS. 19A-20C.

Figure 21:
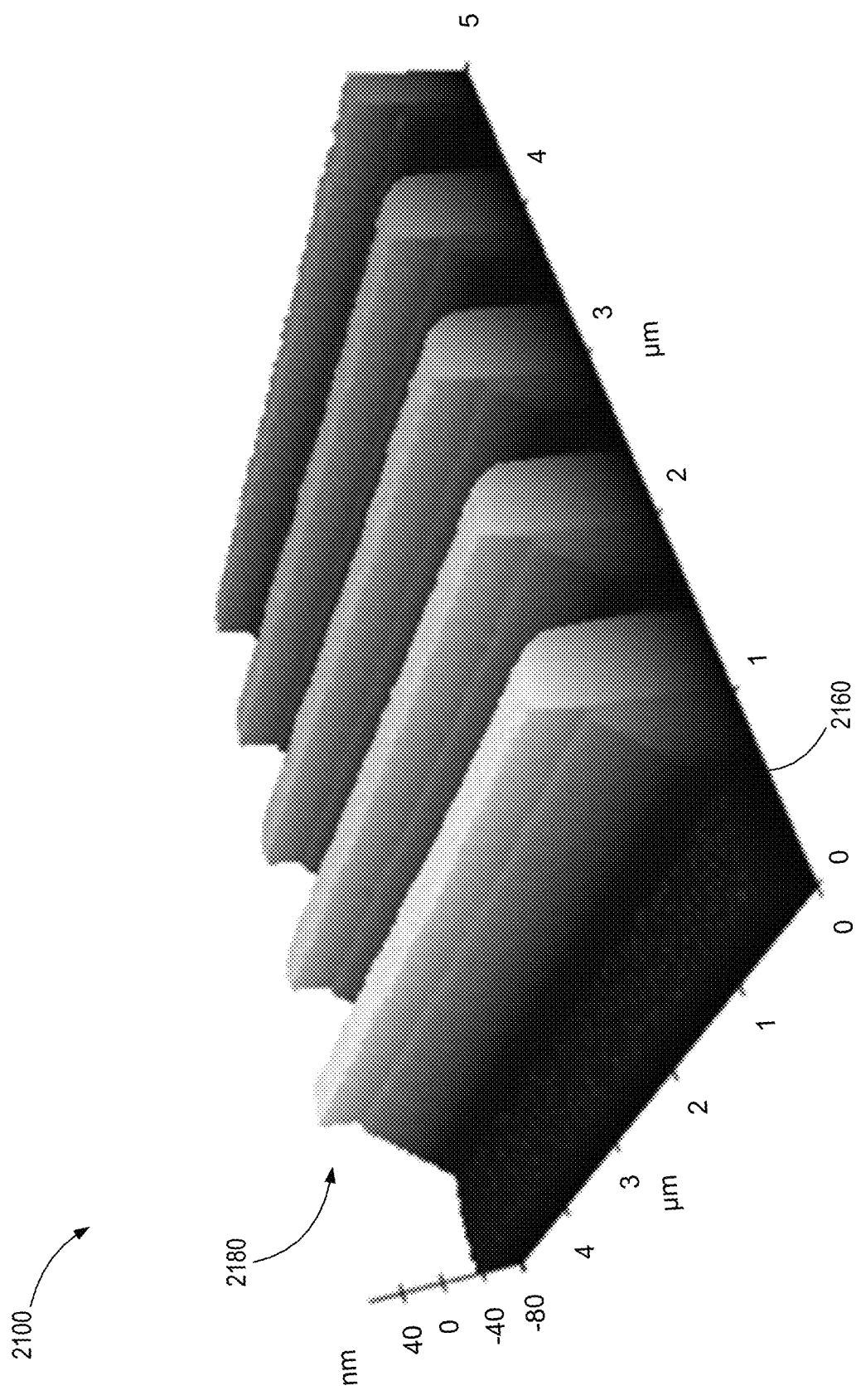
FIG. 21 illustrates an example image of elongated angled ridges of silicon nitride on a glass substrate, according to one embodiment.

FIG. 21 illustrates an example image 2100 of elongated angled ridges 2180 of silicon nitride on a glass substrate 2160, according to one embodiment. The elongated angled ridges 2180 in the image 2100 were formed using the fabrication processes and techniques described herein.

Figure 22:
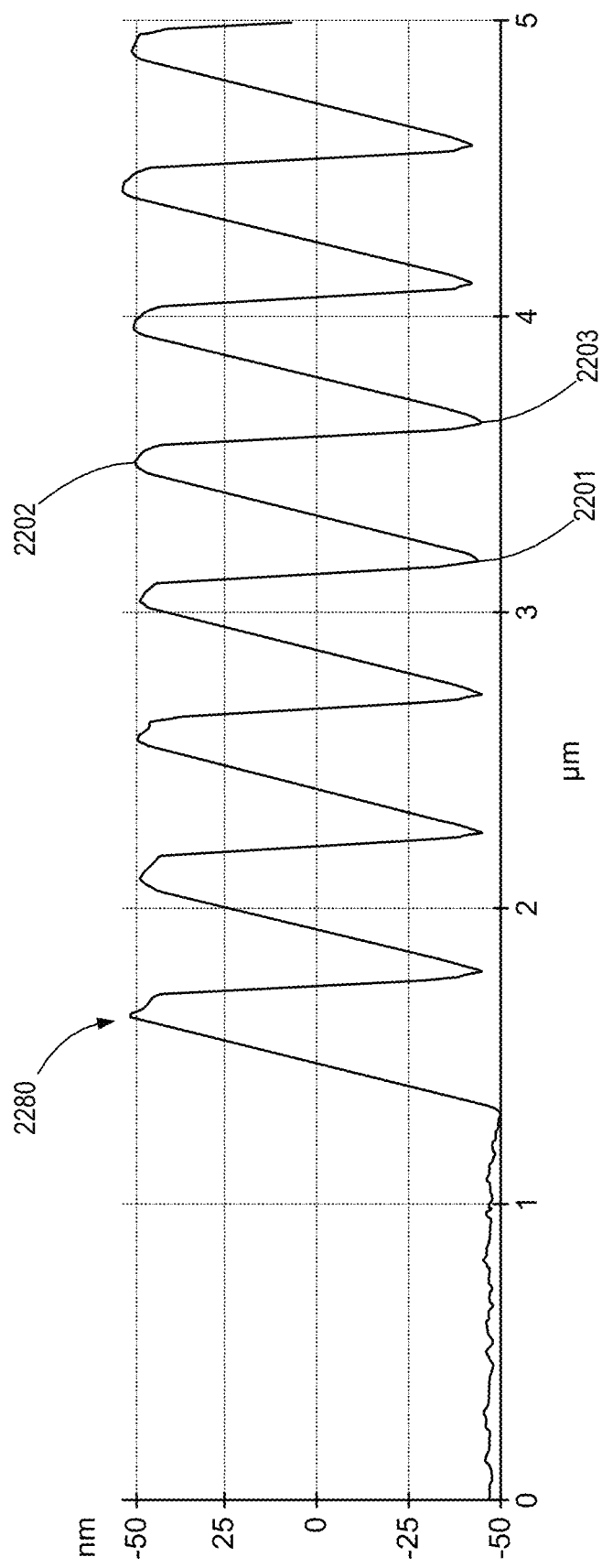
FIG. 22 illustrates an example graph of the height of elongated angled ridges of silicon nitride along the length of a glass substrate, according to one embodiment.

FIG. 22 illustrates an example graph of the height (vertical axis) of a cross-section of a plurality of elongated angled ridges 2280 of silicon nitride forming a slanted grating along the length (horizontal axis) of a glass substrate, according to one embodiment. Notably, the illustrated vertical and horizontal axes use different scales, but the numerical measures are still valid. As described herein, the cross-section of each elongated angled ridge 2280 forms a shape approximating a right triangle. As previously clarified, some fabrication and manufacturing approaches have inherent limitations that may result in features and elements characterized by rounded corners, minor irregularities, and/or vertical or perpendicular faces that are slightly less than vertical or at a slight angle relative to perfect 90 degrees. However, with further refinement of such processes and/or the utilization of additional or alternative processes, near-perfect fabrication shaping is achievable.

In the illustrated embodiment, the distance along the horizontal axis between the point 2201 and the point 2203 corresponds to the width of a base face of what is loosely referred to as a right triangle cross-section of an elongated angled ridge of a slanted grating metasurface coupler. The distance between the point 2203 and the point 2202 along the vertical axis corresponds to the height that the height face of the elongated angled ridge extends from the base face. An angle between the line connecting point 2201 and the point 2202 and the line connecting points 2201 and 2203 corresponds to an inner angle of a hypotenuse or angled face of the elongated angled ridge relative to the base face thereof.

Figure 23:
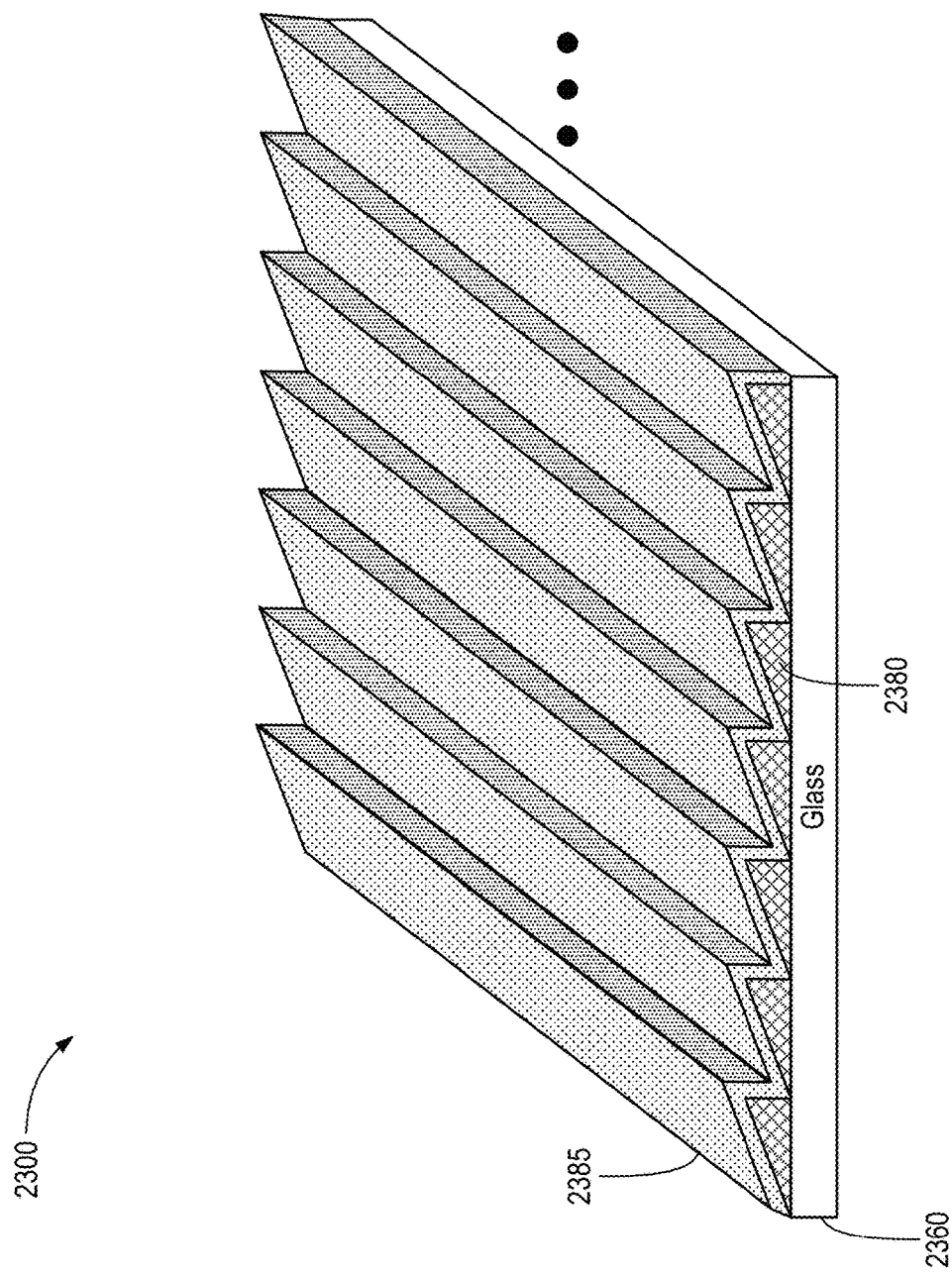
FIG. 23 illustrates a perspective view of an optical device with a slanted grating metasurface coupler with a plurality of elongated silicon nitride angled ridges directly on a glass waveguide, according to one embodiment.

FIG. 23 illustrates a perspective view of an optical device 2300 with a slanted grating metasurface coupler, according to one embodiment. The slanted grating metasurface coupler includes a slanted grating formed as an array of angled ridges 2380 of silicon nitride directly on a glass waveguide 2360, according to one embodiment. An adhesion layer (not shown) adheres the elongated angled ridges 2380 of silicon nitride to an optically reflective metallic layer 2385. The optically reflective metallic layer 2385 may be, for example, at least 100 nanometers thick. The slanted grating of elongated angled ridges 2380 is simplified to only include seven ridges; however, it is appreciated that the slanted grating of the metasurface coupler may have square or rectangular dimensions on the order of centimeters and therefore include many more elongated angled ridges 2380 that have corresponding lengths across the width dimension of the underlying glass waveguide 2360.

FIG. 24A illustrates a diagram of an optical system with a metasurface coupler 2465 of silicon nitride ridges with cross-sections approximating triangles to couple optical radiation from a display engine 2470 into a waveguide 2460, according to various embodiments. The optical radiation from the display engine 2470 is deflected by the metasurface coupler 2465 at an angle less than a critical angle for total internal reflection therein and conveyance, at 2420, to an output coupler 2466 on an opposite end of the waveguide 2460.

FIG. 24B illustrates a close-up image of a portion of the metasurface coupler 2465, according to one embodiment. As illustrated, while the elongated angled ridges of the metasurface couplers are modeled as having cross-sections approximating right triangles (as illustrated in, for example, FIG. 19J, FIG. 20C, or FIG. 23), actual cross-sectional images of the elongated angled ridges 2480 of the metasurface coupler 2465 demonstrate the realities of approximation due to fabrication and manufacturing limitations. Again, refined manufacturing and fabrication techniques allow for a closer approximation to the modeled shapes.

This disclosure has been made with reference to various embodiments, including the best mode. However, those skilled in the art will recognize that changes and modifications may be made to the various embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure as encompassed by the claims below, which form a part of this disclosure.

What is claimed is:

1. An optical system, comprising:
a waveguide;
an optical source to generate optical radiation incident on a first face of the waveguide at an angle of incidence at which the optical radiation passes through the waveguide and out of a second face of the waveguide that is opposite the first face of the waveguide; and
a metasurface on the second face of the waveguide to receive the optical radiation that passes through the waveguide from the optical source, wherein the metasurface is operable to reflect the optical radiation back into the waveguide at an angle greater than a critical angle for total internal reflection within the waveguide, such that the optical radiation is conveyed along a length of the waveguide,
wherein the metasurface comprises:
a slanted grating of angled ridges extending parallel to one another along a width of the waveguide and perpendicular to the length of the waveguide; and
a reflective metallic layer over the array of angled ridges, and
wherein each angled ridge of the slanted grating comprises:
a base face that is co-planar with the second face of the waveguide;
a height face that extends from the base face to a ridge height with an internal angle greater than 60 degrees relative to the base face; and
an angled face that extends between an edge of the base face and an edge of the height face at a target internal angle less than 25 degrees relative to the base face.

2. The system of claim 1, wherein the waveguide comprises at least one of glass and sapphire.

3. The system of claim 1, wherein the optical source comprises at least one of an array of lasers, an array of light-emitting diodes (LEDs), an array of micro light-emitting diodes, and an array of organic light-emitting diodes (OLEDs).

4. The system of claim 1, wherein the angled ridges of the slanted grating comprise angled ridges of silicon nitride positioned directly on the second face of the waveguide.

5. The system of claim 1, wherein the angled ridges of the slanted grating are formed as a one-dimensional array of angled ridges of silicon nitride on a base layer of silicon nitride, wherein the base layer of silicon nitride is less than 30 nanometers thick and is positioned directly on the second face of the waveguide.

6. The system of claim 1, wherein the height face of each angled ridge of the slanted grating is at a right angle with respect to the base face of each respective angled ridge of the slanted grating.

7. The system of claim 6, wherein the height face of each angled ridge of the slanted grating extends from the base face of each respective angled ridge of the slanted grating to a ridge height between 70 and 200 nanometers.

8. The system of claim 7, wherein the target internal angle of the angled face of each angled ridge of the slanted grating relative to the base face of each respective angled ridge of the slanted grating is between 15 and 25 degrees.

9. The system of claim 8, wherein a length of the base face along the length of the waveguide of each angled ridge of the slanted grating is equal to a pitch between adjacent angled ridges in the slanted grating, such that there is substantially no gap between adjacent angled ridges, and wherein the pitch between adjacent angled ridges is between 300 and 500 nanometers.

10. An optical system, comprising:
a slanted grating metasurface formed on a planar face of a waveguide to couple optical radiation passing through the waveguide back into the waveguide for conveyance along a length of the waveguide, the slanted grating metasurface comprising:
an array of elongated silicon nitride ridges extending along a width of the waveguide, wherein a cross-section of each elongated silicon nitride ridge approximates a triangle; and
a reflective metallic layer positioned on the elongated silicon nitride ridges,
wherein an internal angle of an angled face of each elongated silicon nitride ridge is less than 25 degrees relative to the planar face of the waveguide,
wherein each elongated silicon nitride ridge extends to a height between 70 and 200 nanometers from the planar face of the waveguide, and
wherein a pitch between adjacent elongated silicon nitride ridges is between 300 and 500 nanometers.

11. The system of claim 10, wherein the waveguide comprises at least one of glass and sapphire.

12. The system of claim 10, wherein the array of elongated silicon nitride ridges is formed on a base layer of silicon nitride, wherein the base layer of silicon nitride is less than 30 nanometers thick and is positioned directly on the planar face of the waveguide.

13. The system of claim 10, wherein a height face of each elongated silicon nitride ridge of the slanted grating is at a right angle with respect to a base face of each respective elongated silicon nitride ridge of the slanted grating.

14. The system of claim 10, wherein the internal angle of the angled face of each elongated silicon nitride ridge of the slanted grating relative to a base face of each respective elongated silicon nitride ridge of the slanted grating is between 15 and 25 degrees.

15. The system of claim 14, wherein the base face of each elongated silicon nitride ridge of the slanted grating is parallel to the planar face of the waveguide.

16. The system of claim 10, wherein a length of a base face along the length of the waveguide of each elongated silicon nitride ridge of the slanted grating is equal to a pitch between adjacent elongated silicon nitride ridges of the slanted grating, such that there is substantially no gap between adjacent elongated silicon nitride ridges.

* * * * *